United States Patent
Van Vaerenbergh et al.

(10) Patent No.: US 11,057,143 B1
(45) Date of Patent: Jul. 6, 2021

(54) WAVELENGTH DIVISION MULTIPLEXING (WDM)-BASED AND MULTIPATH INTERFEROMETRY BASED OPTICAL TERNARY CONTENT ADDRESSABLE MEMORY (TCAM)

(71) Applicant: HEWLETT PACKARD ENTERPRISE DEVELOPMENT LP, Houston, TX (US)

(72) Inventors: Thomas Van Vaerenbergh, Diegem (BE); Can Li, Palo Alto, CA (US); Catherine Graves, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/905,674

(22) Filed: Jun. 18, 2020

(51) Int. Cl.
*H04J 14/02* (2006.01)
*H04J 14/00* (2006.01)
*G11C 13/04* (2006.01)

(52) U.S. Cl.
CPC ........ *H04J 14/0234* (2013.01); *H04J 14/005* (2013.01); *H04J 14/0236* (2013.01); *G11C 13/04* (2013.01)

(58) Field of Classification Search
CPC .......................... H04J 14/0236; H04J 14/0234
See application file for complete search history.

(56) References Cited

U.S. PATENT DOCUMENTS

| | | | |
|---|---|---|---|
| 7,903,445 B2 * | 3/2011 | Song ...................... | G11C 13/04 365/106 |
| 9,614,751 B2 | 4/2017 | Sekiya et al. | |
| 10,367,590 B2 | 7/2019 | Kielpinski et al. | |
| 2008/0193133 A1 * | 8/2008 | Krug ..................... | G02F 1/3132 398/83 |
| 2014/0016404 A1 * | 1/2014 | Kim ..................... | G11C 7/1057 365/158 |

(Continued)

FOREIGN PATENT DOCUMENTS

WO     2002/017329 A1     2/2002
WO     WO-2019236591       12/2019

OTHER PUBLICATIONS

Alkabani et al., OE-CAM: A Hybrid Opto-Electronic Content Addressable Memory, 2019 (Year: 2019).*

(Continued)

*Primary Examiner* — Jai M Lee
(74) *Attorney, Agent, or Firm* — Sheppard Mullin Richter & Hampton LLP

(57) ABSTRACT

Systems and methods for an optical ternary content addressable memory (TCAM) is provided. In various embodiments, one or more search words can be encoded in a multi-wavelength input signal. Each bit position associated with a set of wavelengths of the input signal, each wavelength corresponding to a logic value. A plurality of copies of the input signal can be coupled to an optical search engine comprising a plurality of rows of stored words. In various embodiments, the search word may be encoded in the amplitude of a single wavelength. Each bit position can be associated with a set input waveguides, and a logic value can be encoded based on whether amplitude of the associated wavelength is detected on a respective input waveguide of the set of waveguides. A mismatch of at least one bit is indicated if light is detected on an output of the optical TCAM.

20 Claims, 15 Drawing Sheets

(56) References Cited

U.S. PATENT DOCUMENTS

2017/0317745 A1* 11/2017 Tezak ............... G11C 11/42
2019/0332708 A1* 10/2019 Strachan ............ G06F 21/552
2019/0356394 A1  11/2019 Bunandar et al.
2020/0258587 A1*  8/2020 Li .................... G11C 7/1006

OTHER PUBLICATIONS

Vagionas et al., Integrated Optical Content Addressable Memories (CAM) and Optical Random Access Memories (RAM) for Ultra-Fast Address Look-Up Operations, 2017, Applied Sciences (Year: 2017).*

Pitris et al., An Optical Content Addressable Memory Cell for Address Look-Up at 10 Gb/s, 2016, IEEE (Year: 2016).*

Alkabani et al., "OE-CAM: A Hybrid Opto-Electronic Content Addressable Memory", Dec. 22, 2019, 14 pages.

David A. B. Miller, "Self-Configuring Universal Linear Optical Component", Photonics Research, 2013, pp. 1-29.

Hamerly et al., "Large-Scale Optical Neural Networks Based on Photoelectric Multiplication", Phys. Rev. X 9, 021032 , May 16, 2019, pp. 021032-1-021032-12.

Han et al., "A tunable optical waveguide ring resonator for microwave photonic filtering", 2013 IEEE International Topical Meeting on Microwave Photonics (MWP 2013), Oct. 2013, pp. 88-91.

Li et al., "Backcoupling manipulation in silicon ring resonators", Photonics Research, vol. 6, No. 6, Jun. 2018, pp. 620-629.

Liang et al., "A Tunable Hybrid III-V-on-Si MOS Microring Resonator with Negligible Tuning Power Consumption", Optical Society of America, 2016, 3 pages.

Pandey et al., "Tunable coupling-induced resonance splitting in selfcoupled Silicon ring cavity with robust spectral characteristics", Jun. 12, 2017, 9 pages.

Reck et al., "Experimental Realization of Any Discrete Unitary Operator", Physical Review Letters, vol. 73, No. 1, Jul. 4, 1994, pp. 58-63.

Shen et al., "Deep learning with coherent nanophotonic circuits", Nature Photonics, vol. 11, Jun. 12, 2017, pp. 441-446.

Tait et al., "Broadcast and Weight: An Integrated Network For Scalable Photonic Spike Processing", Journal of Lightwave Technology, vol. 32, No. 21, Nov. 1, 2014, pp. 3427-3439.

Mourgias-Alexandris et al., "All-optical 10Gb/s Ternary-cam Cell for Routing Look-up Table Applications", Optics Press, vol. 26, No. 6, Mar. 19, 2018, pp. 7555-7562.

Nahmias et al., "A Leaky Integrate-and-Fire Laser Neuron for Ultrafast Cognitive Computing", IEEE Journal of Selected Topics in Quantum Electronics, vol. 19, No. 5, Sep.-Oct. 2013, 12 pages.

Pitris et al., "An Optical Content Addressable Memory Cell for Address Look-up at 10 Gb/s", IEEE Photonics Technology Letters, Aug. 15, 2016, 5 pages.

Tait et al., "Neuromorphic photonic networks using silicon photonic weight banks", Scientific Reports, vol. 7, Aug. 7, 2017, pp. 1-10.

Vagionas et al., "Integrated Optical Content Addressable Memories (CAM) and Optical Random Access Memories (RAM) for Ultrafast Address Look-up Operations", Applied Science, Jul. 7, 2017, pp. 1-18.

* cited by examiner

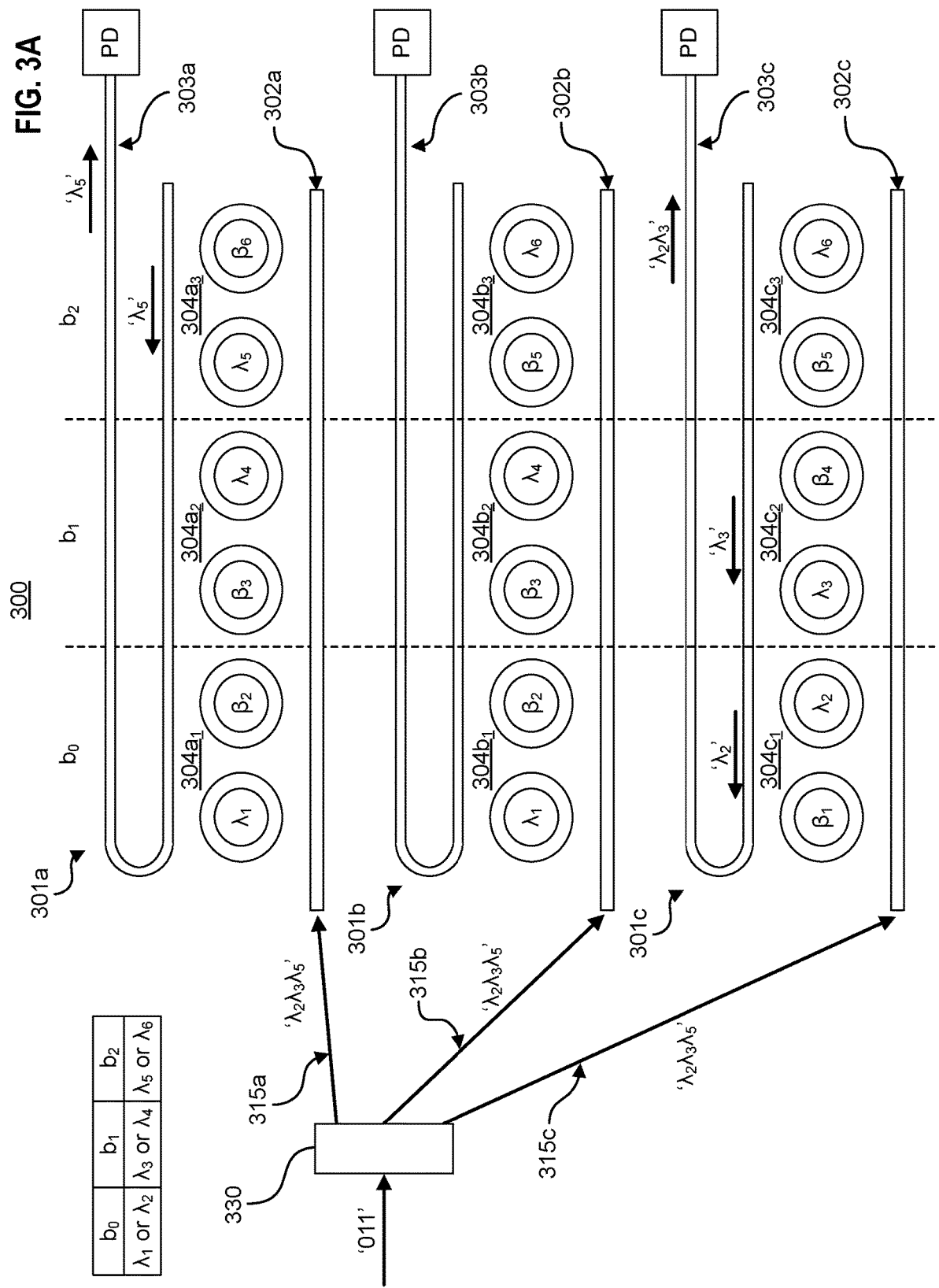

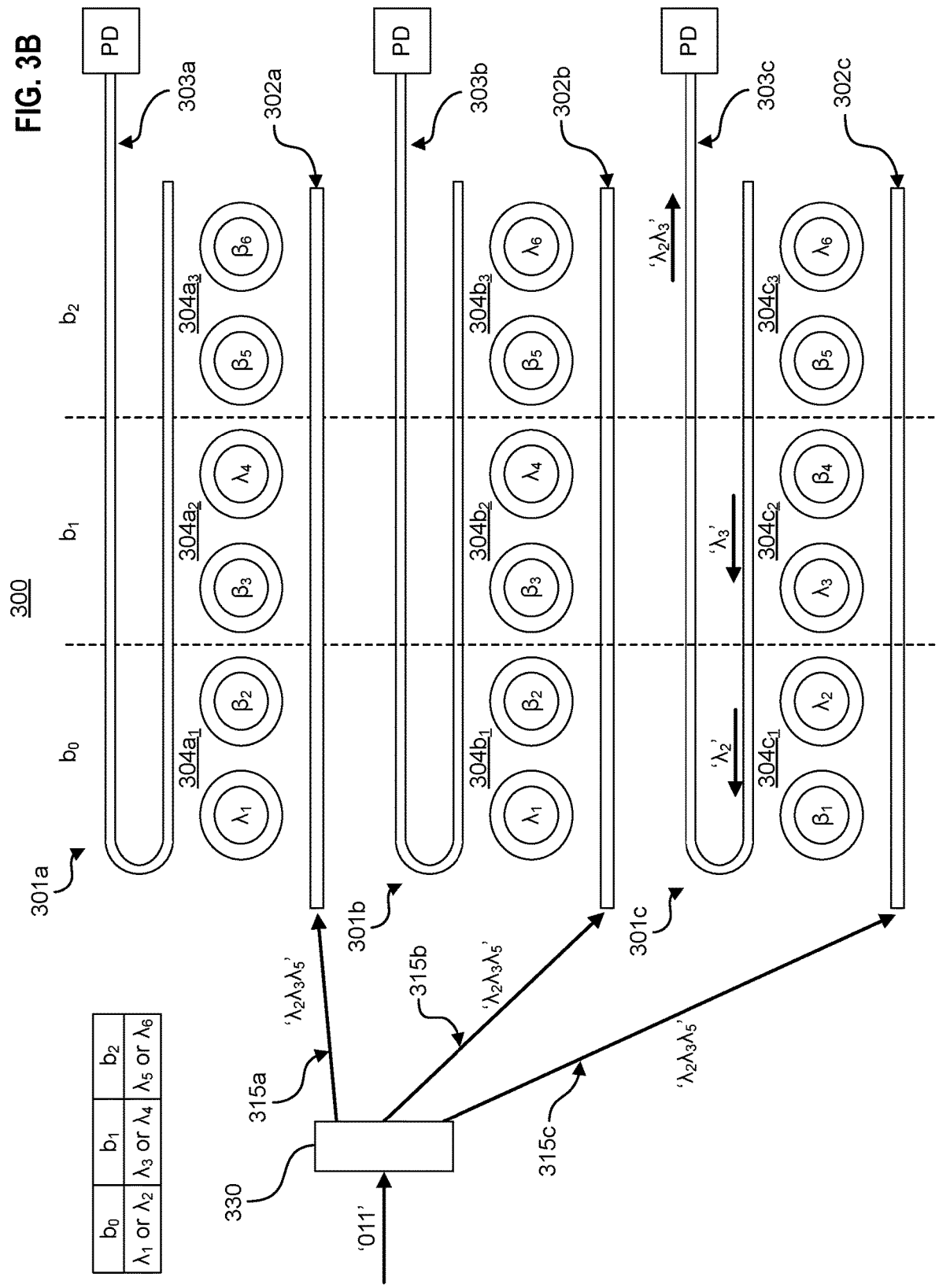

WAVELENGTH DIVISION MULTIPLEXING (WDM)-BASED AND MULTIPATH INTERFEROMETRY BASED OPTICAL TERNARY CONTENT ADDRESSABLE MEMORY (TCAM)

DESCRIPTION OF RELATED ART

Content addressable memory (CAM) is a type of memory that can perform a search operation in which a data string may be input as search content and the resulting output is an address of a location in the memory that stores matching data. This is in contrast to a read operation, in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation, Ternary CAM (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 3A illustrates an example implementation of an encoding scheme in accordance with embodiments of the technology disclosed herein.

FIG. 3B illustrates another example implementation of an encoding scheme in accordance with embodiments of the technology disclosed herein.

Figure 1:
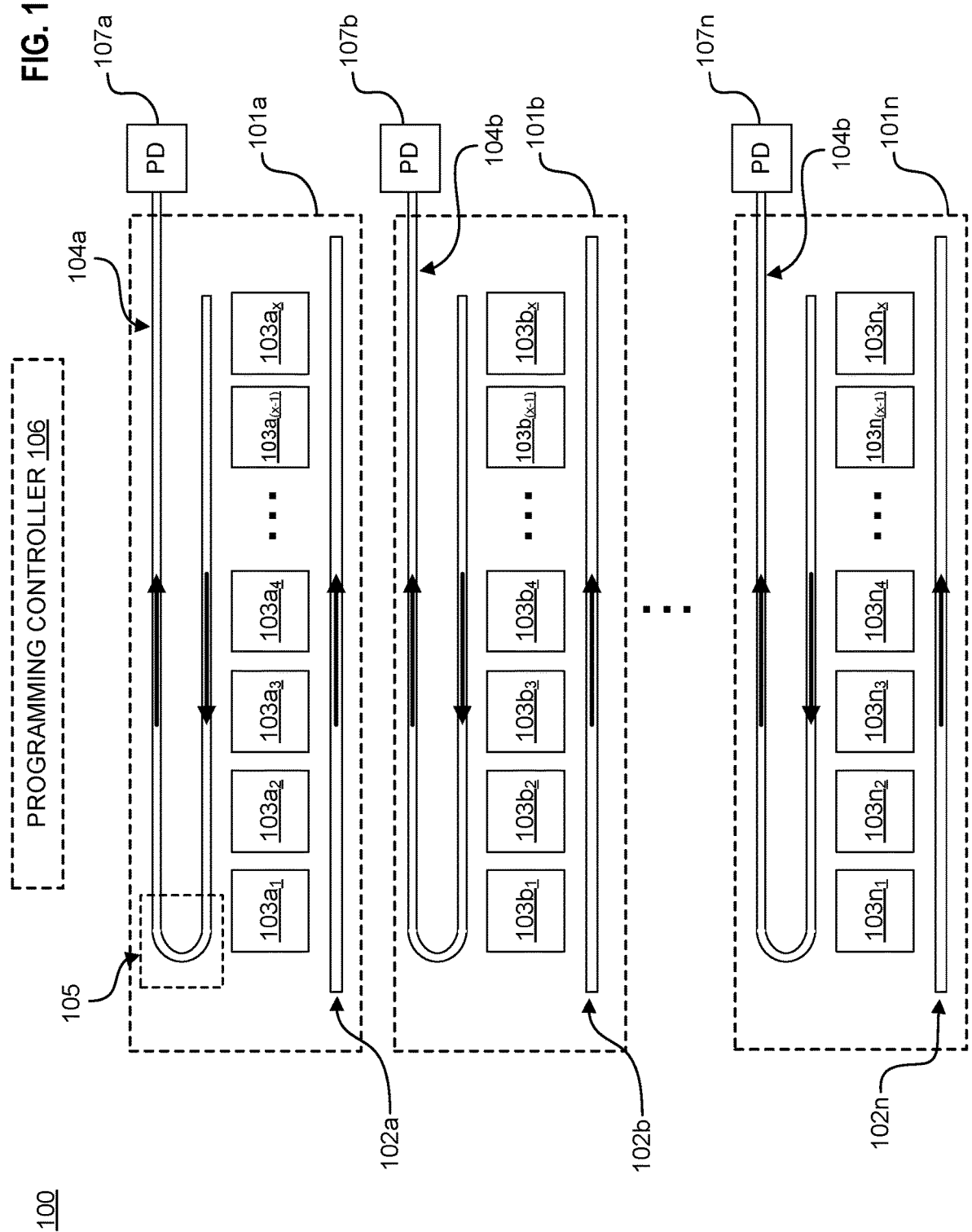
FIG. 1 is an example optical search memory bank in accordance with embodiments of the technology disclosed herein.

The figures are not exhaustive and do not limit the present disclosure to the precise form disclosed.

DETAILED DESCRIPTION

Content addressable memory (CAM) is a special type of memory generally used in high-speed search applications. CAMs comprise hardware (circuitry) that compares an input pattern against stored binary data. The stored data of a CAM is not accessed by its location, but rather access is performed based on its content. A search word is input to the CAM, the CAM searches for the search word in its contents, and, when found, the CAM returns the address of the location where the found contents reside. CAMs are powerful, efficient, and fast. The input patterns and data in CAMs are represented by logic '0's and logic '1's (generally referred to as a binary CAM or bCAM).

Ternary CAM (TCAM) goes beyond the binary nature of bCAM, allowing for the storage and searching for a third value, referred to as a wildcard or "don't care" bit. A stored wildcard bit is treated like a match, regardless of whether the search criterion for the bit of the stored data word is a logic '0' or a logic '1.' In this way, TCAMs allow for additional complexity as the input pattern can represent a range of patterns rather than only one pattern. For example, an input pattern of "01XX0" could indicate a match for four separate stored words: 01000; 01010; 01100; and 01110. TCAMs perform the in-memory comparison operation in a massively parallel way, enabling extremely high throughput compared to older approaches. This increase in throughput enabled Internet packet routing, real-time network traffic monitoring, and more efficient access control lists, among other improvements in applications requiring fast memory comparisons.

Increasingly, data transfer is being performed using optical communication technologies. Transferring data using optics enables extremely higher bandwidth compared to traditional data transfer electronically. Although applications are frequently using integrated optics to transfer data, existing CAM implementations usually require electronic signals. Accordingly, costly optical-to-electrical conversions are required to convert the data from the optical to the electrical domain. Existing CAM and TCAM implementations will increasingly become bottlenecks due to the need for these conversions, reducing the overall efficiency and throughput possible within a network.

Embodiments of the technology disclosed herein provide systems and methods for implementing a TCAM in the optical domain with full ternary search capabilities. In various embodiments, an optical TCAM includes a plurality of word rows, each row comprising a plurality of TCAM cells. Each TCAM cell can store a value at a bit position within a stored word and can store one of three values: logic '0', logic '1', or 'X' (a wildcard value or "don't care" bit). The value is stored in the optical domain using one or more optical filters tuned to pass or block a given wavelength of an input signal. Each bit position of the search word can be associated with two or more wavelengths of a multi-wavelength input signal in various embodiments, and the storing the word in the TCAM can comprise tuning the set of optical filters comprising a TCAM cell to either pass or block according to an encoding scheme. In various embodiments, the search word can be encoded on the multi-wavelength input signal, and a copy of the encoded signal can be coupled to each of the word row of the TCAM. In various embodiments, an optical TCAM can comprise an optical search engine configured to store a plurality of TCAM stored words. In various embodiments, a search word can be encoded using a single wavelength, with the value at each bit position encoded in the amplitude at that wavelength. In various embodiments, the optical search engine can comprise a hardware matrix multiplier comprising a plurality of multipath interferometers configured to apply a matrix multiplication to an input signal encoded with a search word. In some embodiments, the optical search engine comprises a bank of TCAM stored words, wherein each TCAM stored word comprises a plurality of TCAM cells. Each bit position of a search word can be encoded on a single wavelength, and each bit position can be mapped to two input signals. Based on the input waveguide on which an amplitude is detected, the optical search engine can indicate a match or mismatch between bits of the TCAM stored word and the search word.

FIG. 1 illustrates an example optical search memory bank 100 in accordance with embodiments of the technology disclosed herein. The optical search memory bank 100 depicted is provided for illustrative purposes only and should not be interpreted as limiting the scope of the technology disclosed herein to only the illustrated embodiment. As shown in FIG. 1, the optical search memory bank 100 can be used to store a plurality of TCAM entries 101a-n (generally, "the TCAM entry 101," collectively, "the TCAM entries 101") for use in performing a TCAM search operation. In various embodiments, the TCAM entry 101 can comprise an input waveguide 102a to 102n (generally, "the input waveguide 102," collectively "the input waveguides 102"). Each input waveguide 102 can be configured to receive an optical search signal encoded with the word being searched. In various embodiments, an optical coupler can be disposed on a first end of the input waveguide 102 and configured to couple the optical search signal into the input waveguide 102 received from a search input of the optical search memory bank 100.

In various embodiments, each TCAM entry 101 includes a plurality of TCAM cells 103a$_x$ to 103n$_x$ (generally, "the TCAM cell 103," collectively, "the TCAM cells 103"), where the reference x identifies the specific TCAM cell 103 within a given TCAM entry 101 (e.g., TCAM cell 103b$_3$ identifies the third TCAM cell 103 of the second TCAM entry 101b). Each TCAM cell 103 is capable of storing a logical "0", a logical "1", or a wildcard value (i.e., a "don't care" bit). In various embodiments, each TCAM cell 103 comprises an optical filter configurable to pass and block wavelengths of the multi-wavelength optical search signal traveling through the input waveguide 102. As stated above, each search word is encoded on the optical search signal. A multi-wavelength optical search signal can be used in various embodiments, each bit of the search word being encoded on one or more wavelengths. Table 1 illustrates an encoding scheme in accordance with the technology disclosed herein. Specifically, Table 1 shows the wavelength included in the input optical search signal corresponding to each bit value. Each logical bit value '0' and '1' is associated with at least two wavelengths, $\lambda_1$, $\lambda_2$ of a bit position-specific set of wavelengths.

TABLE 1

| Search Word Bit Value | Input ($\lambda_1$, $\lambda_2$) |
| --- | --- |
| 1 | (1, 0) |
| 0 | (0, 1) |
| X | (0, 0) |

As shown in Table 1, the logical bit value '1' is represented where light having the first wavelength $\lambda_1$ is included in the optical search signal, while light having the second wavelength $\lambda_2$ is omitted from the optical search signal. A logical bit value '0' is represented where light having the first wavelength $\lambda_1$ is omitted from the optical search signal, while light having the second wavelength $\lambda_2$ is included in the optical search signal. To search a wildcard value 'X' (the don't care bit), neither wavelength $\lambda_1$, $\lambda_2$ is included in the optical search signal. In this way, the optical search signal can be encoded by including the associated wavelength according to the search word bit value in the optical search signal, while omitting the other associated wavelength. Although discussed in this manner, a person of ordinary skill in the art would understand that the assignment of wavelengths to a bit value can be the reverse. For example, the logical bit value '1' could be associated with including the second wavelength in the optical search signal while omitting the first wavelength. One of ordinary skill in the art would appreciate that the technology disclosed herein is applicable as long as one wavelength in the set of wavelengths is omitted from the search signal.

Although discussed with respect to assigning a set of wavelengths $\lambda_1$, $\lambda_2$, in various embodiments a set of frequencies (e.g., 230 THz and 250 THz) can be assigned to represent each bit position. As is understood in the art, the frequency of a signal is inverse to its wavelength, wherein the product of the frequency and the wavelength of a signal is equal to the speed of light. Accordingly, a corresponding set of frequencies can be determined from an assigned set of wavelengths by dividing the speed of light by each of the wavelengths in the assigned set of wavelengths.

Each bit of the search word can be associated with its own set of wavelengths of the multi-wavelength optical search signal. For example, the first bit of the search word could be associated with wavelengths $\lambda_1$, $\lambda_2$, the second bit of the search would could be associated with wavelengths $\lambda_3$, $\lambda_4$, and so on. In various embodiments, the set of wavelengths assigned to each bit position of the search word may be spaced close together or spaced far apart on the wavelength spectrum of the optical search signal.

As shown in FIG. 1, each of the TCAM cells 103 are optically coupled to the input waveguide 102 of each respective TCAM entry 101. In various embodiments, the output match waveguide 104a-104n (generally, "the output match waveguide 104," collectively, "the output match waveguides 104") are each optically coupled to each TCAM cell 103 of a respective TCAM entry 101. The output match waveguides 104 are configured to output a result of a comparison of the search word encoded in the optical search signal and the stored word of the respective TCAM entry 101. The output match waveguide 104 will have light on it only if one or more of the TCAM cells 103 optically coupled thereto is configured to pass a wavelength within the multi-wavelength optical search signal. In various embodiments, the optical match waveguide 104 can comprise a straight waveguide configured such that any optical output signal within the output match waveguide 104 propagates in the opposite direction of the optical search signal within the input waveguide 102. In some embodiments, the output match waveguide 104 can include a bend 105 configured to turn any optical output signal within the output match waveguide 104. In other embodiments, light within the output match waveguide 104 can propagate in the same direction as light in the input waveguide 102.

Figure 2:
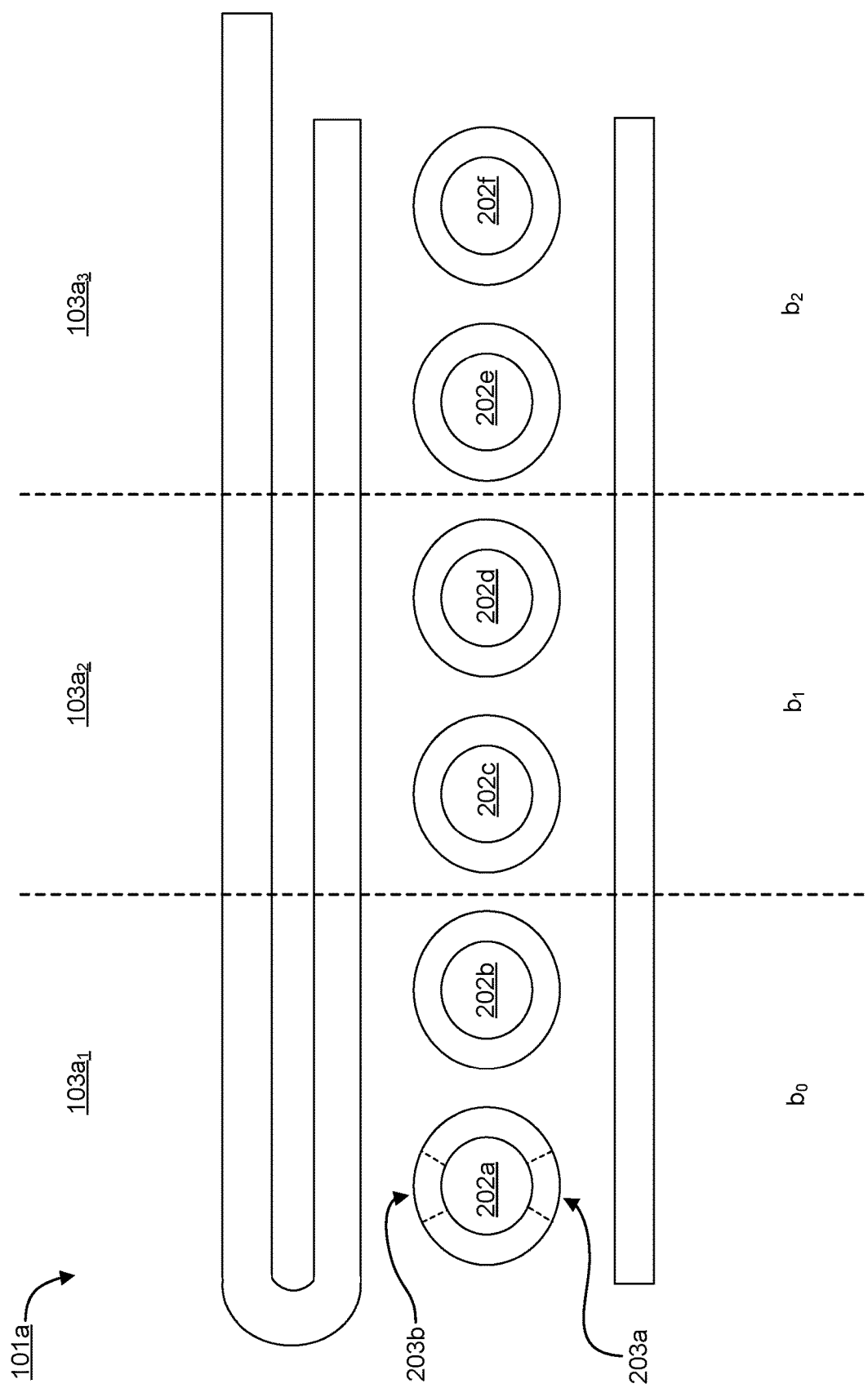
FIG. 2 illustrates an example TCAM entry in accordance with embodiments of the technology disclosed herein.

Each TCAM cell 103 can be encoded in a similar manner as the optical search signal discussed above to store a word. FIG. 2 illustrates an example TCAM entry 101a discussed above with respect to FIG. 1. Where references are the same between different figures of the present disclosure, any discussion of the reference is applicable to all instances of the reference regardless of the figure, unless otherwise stated. Although discussed with respect to TCAM entry 101a, the discussion is applicable to the other TCAM entries 101 unless otherwise stated. As shown in FIG. 2, the TCAM cell $103a_1$ corresponds to the first bit $b_0$, the TCAM cell $103a_2$ corresponds to the second bit $b_1$, and the TCAM cell $103a_3$ corresponds to the third bit $b_2$. For ease of discussion, the search word referenced with respect to FIG. 2 is a three-bit word, and the TCAM entry 101 includes three TCAM cells 103 accordingly. In other embodiments, the search word may be longer, and in such embodiments the TCAM entry 101 can comprise a plurality of TCAM cells 103 corresponding to the number of bit positions in the search word, and the embodiment depicted in FIG. 2 should not be interpreted as limiting the scope of the technology to any specific search word length. In various embodiments, each TCAM cell $103a_1$, $103a_2$, and $103a_3$ can comprise two optical filters 202a-f (generally, "the optical filter 202," collectively, "the optical filters 202"). In various embodiments, the optical filters 202 can comprise ring resonators, wherein each ring resonator includes an input coupling region 203a optically coupled to the input waveguide 102 and an output coupling region 203b optically coupled to the output match waveguide 104. In other embodiments, the optical filters 202 may comprise one or more wavelength-selective interferometers, including but not limited to a Mach-Zehnder interferometers (MZIs), lattice filters, photonic crystal cavity-based filters, Bragg filters, among other standing wave resonator-based filters. In various embodiments, the optical filters 202 may comprise one or more different types of optical filters (e.g., ring and interferometer). In some embodiments, the optical filters 202 may comprise short, straight, tunable waveguide sections. In various embodiments, the optical filters 202 may be implemented as bandpass filters, configured to enable light having a particular wavelength to be filtered out of the optical search signal traveling through the input waveguide 102. In various embodiments, each optical filter 202 may be tunable to one of two different wavelengths depending on the bit position of the search word with which the TCAM cell 103 is associated. In the depicted embodiment, each optical filter 202 is optically coupled to the input waveguide 102 of the TCAM entry 101. In other embodiments, a first set of optical filters of the plurality of optical filters 202 may be optically coupled to the input waveguide 102 and each of a second set of optical filters may be optically coupled to a different one of the first set of optical filters. In some embodiments, the first set of optical filters and the second set of optical filters can comprise one or more of the same type of optical filter 202 or a combination of different optical filters. In various embodiments, one or more isolators may be coupled to the input waveguide to address back reflection of light from the optical filters.

As shown in FIG. 1, a photodetector 107a-n (generally, "the photodetector 107," collectively, "the photodetectors 107") can be optically coupled to a results end of each output waveguide 104 of the plurality of TCAM entries 101. As discussed above, each TCAM cell 103 can be configured to pass light of specific wavelengths from the optical search signal on the input waveguide to the output waveguide 104. The photodetectors 107 can be configured to sense whether any light is present on the output match waveguide 104. Depending on whether light is or is not detected, each photodetector 107 can indicate whether there is a match between the search word encoded on the optical search signal and the stored word of the respective TCAM entry 101. In various embodiments, one or more of the photodetectors 107 can comprise a photodiode or other type of circuit-type detector of photons. In various embodiments, each photodetector 107 can include circuitry configured to output a memory address corresponding to the stored word of the TCAM entry 101. In some embodiments, each photodetector 107 can output a match/mismatch indication to an encoder circuit (not shown in FIG. 1) configured to generate the memory address corresponding to the stored word of one or more TCAM entries 101 for which a match indication is received from a photodetector 107. In some embodiments, each photodetector may send the indication to a processing circuit within the optical search memory bank 100 (not shown in FIG. 1) being configured to identify the memory address associated with the specific TCAM entry 101 and output an electrical signal to a memory controller or other device controller access to the memory storage.

Each optical filter 202 of the respective TCAM cell 103 can be independently tuned to pass or block certain wavelengths of the multi-wavelength optical search signal, allowing the optical search memory bank 100 of FIG. 1 to provide full ternary search functionality in the optical domain. In various embodiments, each TCAM cell 103 can be programmed to store one of three logical values: a logic '0', a logic '1', or a wildcard value (i.e., a "don't care" bit). In various embodiments, one or more tuning components coupled to each optical filter 202 can be used to tune each of the optical filters $202_{ai}$, $202_{bj}$ of each TCAM cell 103 (e.g., optical filters 202c, 202d of TCAM cell $103a_2$ of FIG. 2) to store one of the logical values. In various embodiments, the one or more tuning components can comprise one or more devices configured to change the refractive index of the core or cladding, control the number of free carriers, and/or create a red and/or blue shift of the resonance wavelength of the optical filters 103.

Table 2 shows the tuned wavelengths $\lambda_x$, $\lambda_y$ for each of the two optical filters $202_{ai}$, $202_{bj}$ to store a corresponding bit value within each TCAM cell 103.

TABLE 2

| Bit Value | Optical Filter $202_{ai}$ ($\lambda_1$, $\beta_1$) | Optical Filter $202_{bj}$ ($\beta_2$, $\lambda_2$) |
|---|---|---|
| 0 | $\lambda_1$ | $\beta_2$ |
| 1 | $\beta_1$ | $\lambda_2$ |
| X | $\beta_1$ | $\beta_2$ |

As shown in Table 2, each TCAM cell 103 can store values based on the wavelengths that each optical filter $202_{ai}$, $202_{bj}$ of the TCAM cell 103. As shown, a TCAM cell 103 can store a logical bit value '0' by tuning the first optical filter $202_{ai}$ to pass a first wavelength $\lambda_1$ associated with the respective bit position of the search word, and tuning the second optical filter $202_{bj}$ to pass a random wavelength $\beta_2$ outside of the plurality of wavelengths in the multi-wavelength optical search signal. a TCAM cell 103 can store a logical bit value '1' by tuning the first optical filter $202_{ai}$ to pass a random wavelength $\beta_1$ outside of the plurality of wavelengths in the multi-wavelength optical search signal, and tuning the second optical filter $202_{bj}$ to pass a second wavelength $\lambda_2$ associated with the respective bit position. To store a wildcard value within a TCAM cell 103, both the first optical filter $202_{ai}$ and the second optical filter $202_{bj}$ can be tuned to pass a random wavelength $\beta_1$ and $\beta_2$, respectively. In some embodiments, the random wavelength $\beta_1$ and/or the random wavelength $\beta_2$ may be a wavelength close to the first and second wavelengths $\lambda_1$, $\lambda_2$ while in other embodiments the random wavelength $\beta_1$ and/or the random wavelength $\beta_2$ may be a wavelength several wavelengths away from the set of wavelengths $\lambda_1$, $\lambda_2$ of the bit position-specific set of wavelengths along the wavelength spectrum of the multi-wavelength input signal. By setting each optical filter to a wavelength that is not contained in the optical search input the TCAM cell is capable of blocking both of the wavelengths associated with the respective bit position. In various embodiments, the random wavelengths $\beta_1$ and $\beta_2$ may be the same wavelength outside the range of wavelengths in the multi-wavelength optical search signal. In various embodiments, the random wavelengths $\beta_1$ and $\beta_2$ may be a wavelength between the two wavelengths of the bit position-specific set of wavelengths associated with the bit position, wherein the random wavelength $\beta1$ and $\beta_2$ has a reduced resonance strength compared to the two wavelengths associated with the bit position. In some embodiments, a coupling control (not shown in FIG. 2) can be disposed to control the coupling efficiency of a coupling region (e.g., 203a) of the optical filter to reduce the strength of the random wavelength $\beta1$ and $\beta_2$. In various embodiments, the allocation of pass/block may be reversed, depending on how the search word is encoded into the optical search signal.

In various embodiments, words stored in the TCAM entries 101 can be written electronically. Referring to FIG. 1, a programming controller 106 can be communicatively coupled to one or more tuning components (not shown for ease of illustration) and configured to apply a necessary stimulus to the tuning components to tune the optical filters 202 as required to store the bit value. In various embodiments, the programming controller 106 can comprise a processing component, a field programmable gate array (FPGA), an application specific integrated circuit (ASIC), or other type of processor present in computing systems. In various embodiments, the programmable controller 106 can independently adjust one or more of the tuning components to tune each of the optical filters 202. One or more tuning components can be coupled to each of the optical filters 202 within the optical search memory bank 100. In various embodiments, the one or more tuning components can comprise one or more devices configured to change the refractive index of the core or cladding, control the number of free carriers, and/or create a red shift of the resonance wavelength of the optical filters 202. Non-limiting examples of tuning components include heaters, electrical contacts, among other devices used to tune the resonance wavelength of optical components. After receiving a write signal, the programming controller 106 can determine one or more adjustment parameters to tune each optical filter 202 according to the bit value that is to be stored at a specific bit position of a search word. In various embodiments, the programming controller 106 can determine an adjustment signal for each word to be stored, and send the respective adjustment signal to a TCAM entry 101 so that the word is stored and possible to be searched.

Using the encoding scheme discussed above, the optical search memory bank 100 discussed with respect to FIGS. 1 and 2 can be used to provide full ternary search functionality in the optical domain. In this way, optical-to-electrical conversions can be avoided and the TCAM search can be performed faster. Based on the logic states indicated in Tables 1 and 2, light will be on the output match waveguide 104 of a TCAM entry only when at least one TCAM cell 103 of the TCAM entry is configured to pass light of one of the two wavelengths associated with the respective bit position of the search word. Table 3 shows the results based on the encoded bit value on the optical search signal and within the corresponding TCAM cell.

TABLE 3

| Input ($\lambda_1$, $\lambda_2$) | TCAM Cell ($\lambda_1$, $\lambda_2$) | Match/Mismatch (passed/blocked) |
| --- | --- | --- |
| 1/(1, 0) | 1/(block, pass) | Match (blocked) |
| 0/(0, 1) | 0/(pass, block) | Match (blocked) |
| 1/(1, 0) | 0/(pass, block) | Mismatch (passed) |
| 0/(0, 1) | 1/(block, pass) | Mismatch (passed) |
| X/(0, 0) | ANY | Match (blocked) |
| ANY | X/(block, block) | Match (blocked) |

As shown in Table 3, when the bit of the encoded word is a logical '1', the input (optical search signal) includes the first wavelength $\lambda_1$ associated with that bit position and omits the second wavelength $\lambda_2$. A match is indicated when the TCAM cell is configured to block the first wavelength $\lambda_1$ and pass the second wavelength $\lambda_2$. Because only the first wavelength $\lambda_1$ is included in the optical search signal, no light is filtered out by the TCAM cell from the input waveguide and into the output match waveguide. Because no light is detected by the respective photodetector coupled to the end of the output match waveguide, a match is indicated by the photodetector, either by generating an address corresponding to the stored word or sending an indication signal to an encoder.

When the bit of the encoded word is a logical '0', the input (optical search signal) omits the first wavelength $\lambda_1$ associated with that bit position and includes the second wavelength $\lambda_2$. A match is indicated when the TCAM cell is configured to pass the first wavelength $\lambda_1$ and block the second wavelength $\lambda_2$. Because only the second wavelength $\lambda_2$ is included in the optical search signal, no light is filtered out by the TCAM cell from the input waveguide and into the output match waveguide. Because no light is detected by the respective photodetector coupled to the end of the output match waveguide, a match is indicated by the photodetector, either by generating an address corresponding to the stored word or sending an indication signal to an encoder.

In addition, a match is indicated regardless of whether the bit of the optical search signal is a '1' or a '0' when the TCAM cell is configured to store a wildcard value 'X'. The wildcard value represents the "don't care" bit, meaning that the stored word represents more than one memory address. For example, if the stored word is '01X10' than a match would be indicated if the input (optical search signal) is '01110' or '01010'. In this way, one TCAM entry can indicate a match for two separate input signals. The capability to store a wildcard value 'X' enables each TCAM entry to represent multiple words at the same time, increasing the functionality of the TCAM.

FIG. 3A is an example implementation of the encoding scheme shown in Table 3 within an example optical search memory bank 300. For ease of discussion, the example optical search memory bank 300 comprises a three-bit TCAM entry, having three TCAM cells consistent with the example TCAM cells 103 discussed with respect to FIG. 2 (i.e., two optical filters per TCAM cell). The example is applicable to TCAMs capable of comparing search words and stored words with a larger number of bits. Moreover, the optical search memory bank 300 can be similar to the optical search memory bank 100 discussed with respect to FIGS. 1 and 2, and the discussion concerning optical search memory bank 100 is applicable to the example optical search memory bank 300 of FIG. 3A, unless otherwise stated.

As shown in FIG. 3A, the example search word is '011', which is encoded onto a multi-wavelength search signal. The multi-wavelength search signal can be converted into a plurality of optical search signals, such as the optical search signals discussed above with respect to FIGS. 1 and 2, by a search input 330. In various embodiments, the search input 330 may comprise an input splitter configured to convert a wavelength into a plurality of optical search signals. In some embodiments, the search word may be received by the search input 330 electrically (e.g., over a search line trace on a substrate) and then encoded onto a multi-wavelength optical signal by the search input 330. In such embodiments, the search input 330 can comprise a light source and modulator configured to encode a multi-wavelength optical signal with the received search word, and to create a plurality of optical search signals discussed above. In other embodiments, the search word may be received already encoded on a multi-wavelength search signal (i.e., received optically) by the search input 330. In such embodiments, the search input 330 can comprise one or more devices for creating a plurality of optical search signals by splitting and/or demultiplexing the multi-wavelength search signal.

In various embodiments, the search input 330 can comprise a plurality of outputs, each configured to optically couple to a first end of the input waveguide 302 of the respective TCAM entry 301. As depicted in FIG. 3A, the search input 330 creates three optical search signals 315a, 315b, 315c (generally, "the optical search signal 315," collectively, "the optical search signals 315"), each of which is coupled to an input waveguide 302 of a respective TCAM entry 301. In various embodiments, each output may be optically coupled to the first end of an input waveguide 302 using a grating coupler, mirror, or other directional optical device. In some embodiments, the first end of each input waveguide 302 may be disposed at an output of the search input 330 (i.e., the input waveguides 302 extending from the output of the search input 330.

As illustrated in FIG. 3A, each bit of the search word is associated with two different wavelengths of light. The first bit $b_0$ is associated with wavelengths $\lambda_1$, $\lambda_2$, the second bit $b_1$ is associated with wavelengths $\lambda_3$, $\lambda_4$, and the third bit $b_2$ is associated with wavelengths $\lambda_5$, $\lambda_6$. By associating each bit position with a different set of wavelengths the optical search memory bank 300 is capable of comparing each bit of the search word with a corresponding TCAM cell independently of the other bits of the search word. In various embodiments, the set of wavelengths assigned to each bit position may be chosen such that the wavelength spacing between the first wavelength for the bit position and the second wavelength for that bit position is more than two wavelengths away, while in other embodiments the set of wavelengths may comprise neighboring wavelengths on the spectrum of potential wavelengths for the search word. Here, each optical search signal 315a-c (generally, "the optical search signal 315," collectively, "the optical search signals 315") comprises a multi-wavelength signal comprising the second wavelength $\lambda_2$, the third wavelength $\lambda_3$, and the fifth wavelength $\lambda_5$. One of the optical search signals 315 is optically coupled into the input waveguide 302 of a respective TCAM entry 301.

In the depicted embodiment of FIG. 3A, the TCAM entry 301a is set to store the word '010', the TCAM entry 301b is set to store the word '011', and the TCAM entry 301c is set to store the word '101'. As the optical search signal 315a propagates through the input waveguide 302a, no light is passed through the first two TCAM cells 304$a_1$, 304$a_2$ into the output match waveguide 303a. The TCAM cell 304$a_1$ is configured to store a logical '0', with the first optical filter being set to pass light having the first wavelength $\lambda_1$ associated with the first bit $b_0$, while the second optical filter is set to block light having the second wavelength $\lambda_2$ associated with the first bit $b_0$ by being set to the random wavelength $\lambda_2$. When the optical search signal 315a passes the first and second optical filter, no light is filtered out because the optical search signal does not include the first wavelength $\lambda_1$ and is configured to block the second wavelength $\lambda_2$. Therefore, no light enters the output match waveguide 303a, indicating that the first and second bits $b_0$, $b_1$ matched between the search word and the stored word. In various embodiments, each optical filter may be capable of being tuned to the same random wavelength β that is configured to block all of the wavelengths associated with all the bit positions within the search word.

Although the first two TCAM cells 304$a_1$, 304$a_2$ match with the bit of the search word, the third TCAM cell 304$a_3$ is configured to store a logic '0', instead of a logic '1' as in the search word. By configuring the first optical filter of the third TCAM cell 304$a_3$ to pass the fifth wavelength $\lambda_5$ (i.e., the first wavelength associated with the third bit $b_2$) and the second optical filter of the third TCAM 304$a_3$ to block the sixth wavelength $\lambda_6$ (i.e., the second wavelength associated with the third bit $b_2$), the third TCAM cell 304$a_3$ will pass light of the fifth wavelength $\lambda_5$ through the first optical filter of the third TCAM cell 304$a_3$ into the output match waveguide 303a. The photodetector disposed on the results end of the output match waveguide 303a will therefore detect light on the output match waveguide 303a, indicating that the word stored in the TCAM entry 301a does not match the search word on the optical search signal. In a similar manner, the third TCAM entry 301c indicates a mismatch between the search word and the stored word because the first TCAM cell 304$c_1$ and the second TCAM cell 304$c_2$ are configured to pass light into the output match waveguide 303c (i.e., TCAM cell 304$c_1$ is set as a logical '1' and TCAM cell 304$c_2$ is set as a logical '0'). Accordingly, the second wavelength associated with the first bit $b_0$ and the third wavelength (i.e., the first wavelength associated with the second bit $b_1$) are detected on the output match waveguide 303c by the associated photodetector. The second TCAM entry 301b of the optical search memory bank 300 is configured to match the search word, and therefore each TCAM cell 304$b_1$, 304$b_2$, 304$b_3$ is configured to not filter light of any wavelength into the output match waveguide 303b. Because no light is detected on the output match waveguide 303b, the associated photodetector indicates a match between the stored word and the search word. In various embodiments, the photodetector can be configured to output an address corresponding to the stored word, or an indication of a match to an encoder or other entity that is configured to generate an address corresponding to the stored word.

FIG. 3A illustrates an example encoding where each of the TCAM entries 301 are storing either a logic '0' or a logic '1'. FIG. 3B is another example implementation using the optical search memory bank 300 discussed with respect to FIG. 3A. However, the TCAM cell $304a_3$ in FIG. 3B is set to store a wildcard value 'X', meaning the first optical filter of TCAM cell $304a_3$ and the second optical filter of TCAM cell $304a_3$ are set to a random wavelength $\beta_5$ and $\beta_6$, respectively. In various embodiments, the random wavelengths $\beta_5$ and $\beta_6$ may be the same wavelength. By storing the wildcard value 'X' in the third TCAM cell $304a_3$ of the first TCAM entry 301a, it is possible for a match to be indicated between the stored word of TCAM entry 301a and both the search word '011' and '010'. As shown in FIG. 3B, unlike in the example of FIG. 3A, the output match waveguide 303a does not have any light on it. Therefore, the photodetector of the first TCAM entry 301a will also indicate a match with the search word '011' like the second TCAM entry 301b. In this way, more than one memory address can be generated, each associated with the stored words in the first TCAM entry 301a and the second TCAM entry 301b.

Figure 3C:
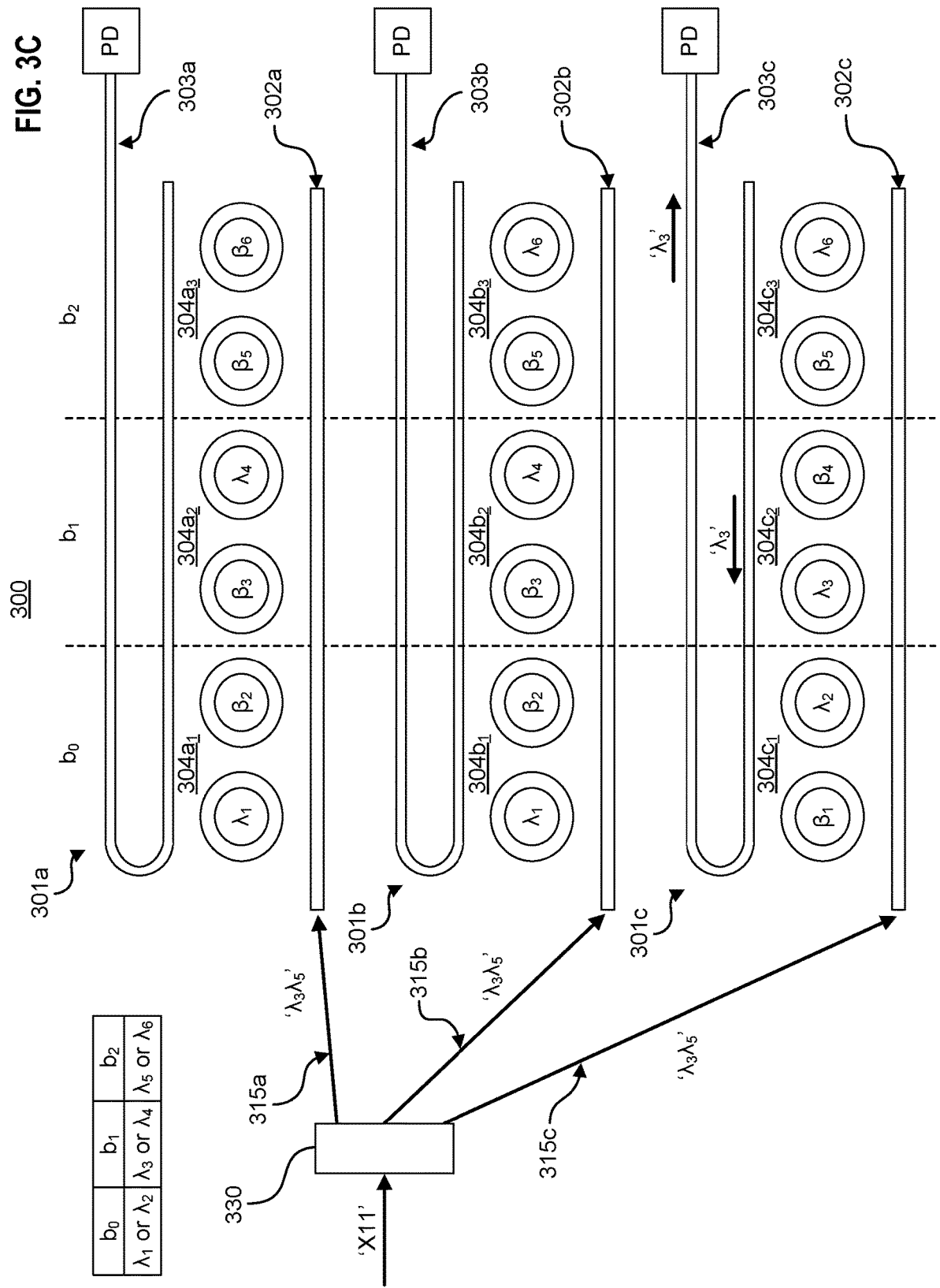
FIG. 3C illustrates another example implementation of an encoding scheme in accordance with embodiments of the technology disclosed herein.

FIG. 3C shows an implementation of the optical search memory bank 300 wherein the search word includes a "don't care" bit. The search word in FIG. 3C is 'X11', meaning that the search does not care what the first bit of the stored word is. Where a wildcard value 'X' is included in the search word, the multi-wavelength optical signal onto which the search word is encoded omits both of the wavelength associated with the respective bit. As depicted in FIG. 3C, the first bit $b_0$ of the search word comprises a wildcard value 'X', therefore the optical search signals 315 only include the third wavelength $\lambda_3$ (associated with the second bit $b_1$) and the fifth wavelength $\lambda_5$ (associated with the third bit $b_2$). Therefore, when the optical search signal 315c propagates through the input waveguide 302c of the third TCAM entry 301c, no light having a wavelength associated with the first bit $b_0$ is filtered into the output match waveguide 303c. Rather, only light having the third wavelength $\lambda_3$ is detected on the output match waveguide 303c.

Figure 3D:
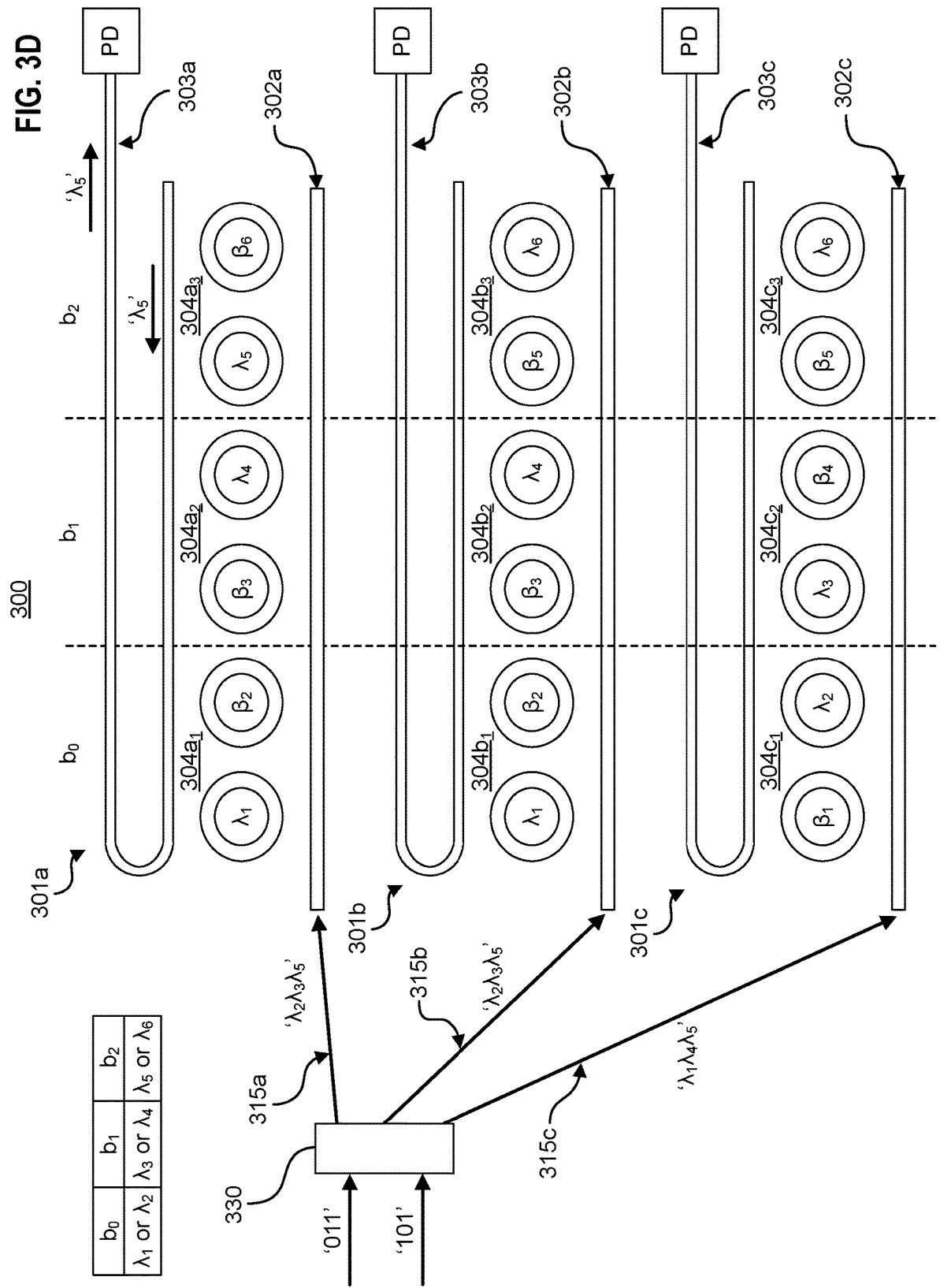
FIG. 3D illustrates another example implementation of an encoding scheme in accordance with embodiments of the technology disclosed herein.

In some embodiments one or more search words may be received by the search input 330. In such cases, each of the optical search signals 315 may be encoded with one of the two search words. FIG. 3D illustrates an implementation where more than one search word is received. As depicted, the first search word is '011' (like with respect to FIGS. 3A-3C) and the second search word is '101'. The optical search signals 315a, 315b are each encoded with the search word '011', while the optical signal 315c is encoded with the second search word '101'. Because the optical search signal 315c is encoded with the second search word '101' (i.e., includes the wavelengths $\lambda_1\lambda_4\lambda_5$), a match is indicated on the output match waveguide 303c of the third TCAM entry 301c. In various embodiments, the optical search signal 315c may be routed to a set of TCAM entries 301 for parallel searching.

Figure 4:
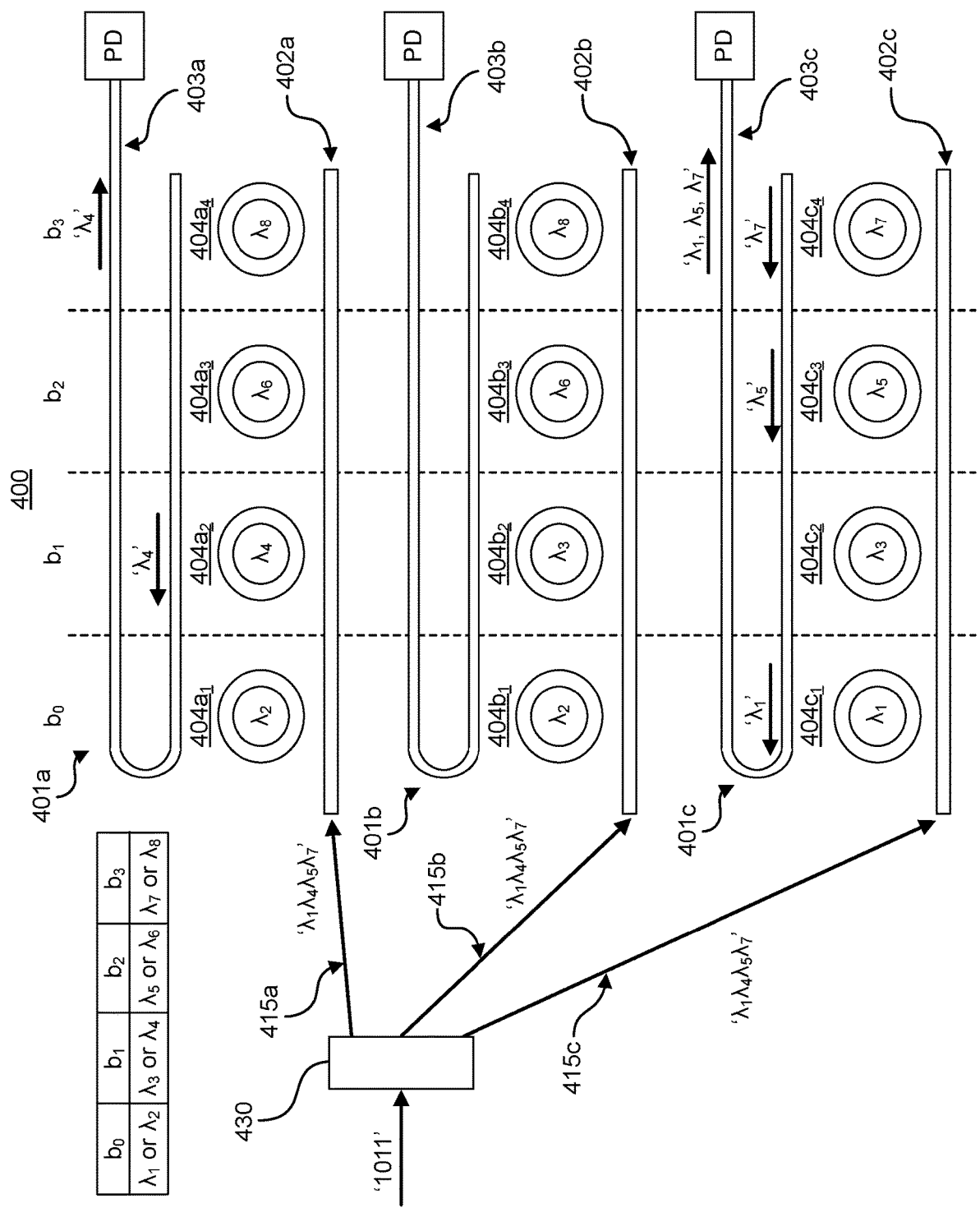
FIG. 4 is another example optical search memory bank in accordance with embodiments of the technology disclosed herein.

Although the technology has been discussed so far with respect to TCAM cells comprising sets of optical filters, in some embodiments each TCAM cell can be implemented using a single optical filter. FIG. 4 illustrates an example optical search memory bank 400 wherein each TCAM cell 404 is implemented as a single optical filter in accordance with the technology disclosed herein. The example optical search memory bank 400 is provided for illustrative purposes only and should not be interpreted as limiting the scope of the technology to only the depicted embodiment. As shown in FIG. 4, each TCAM entry 401a-c comprises four bits $b_0$, $b_1$, $b_2$, $b_3$, with each TCAM cell 404 comprising a single optical filter. Table 4 shows the tuned wavelengths $\lambda_x$, $\lambda_y$, and $\beta_x$ for the optical filter to store a corresponding bit value within each TCAM cell 401.

TABLE 4

| Bit Value | Optical Filter ($\lambda_1$, $\lambda_2$, $\beta_x$) |
|---|---|
| 0 | $\lambda_1$ |
| 1 | $\lambda_2$ |
| X | $\beta_x$ |

As seen in Table 4, when a single optical filter is used it is tunable to at least three wavelengths in various embodiments: the first wavelength $\lambda_1$, the second wavelength $\lambda_2$, and a random wavelength $\beta_x$ (i.e., any wavelength not assigned to any bit position) associated with the respective bit position. In various embodiments, each optical filter may be configured to tune to only one of the three wavelengths associated with the bit position. Detecting the results of the search on a common output match waveguide 403 of the respective TCAM entry 401 enables the storage of the wildcard value 'X'. As shown in FIG. 4, each optical search signal 415a-c is encoded with the search word '1011'. Similar to the implementations discussed with respect to FIGS. 3A-3D, each optical search signal 415 is optically coupled to an input waveguide 402 of the respective TCAM entry 401. The same encoding scheme discussed with respect to Table 3 can be implemented with a single optical filter, as in FIG. 4, only by setting the optical filter of the TCAM cell 404 to pass either the first wavelength $\lambda_1$ or the second wavelength $\lambda_2$, in addition to blocking both wavelengths when set to the random wavelength $\beta_x$. In various embodiments, each of the optical filters of FIG. 4 can be designed for tuning to one of the three wavelengths using one or more tuning components (not shown in FIG. 4) can be used to tune the wavelength of each optical filter, such as the tuning components discussed above with respect to FIGS. 1-3D.

Figure 5:
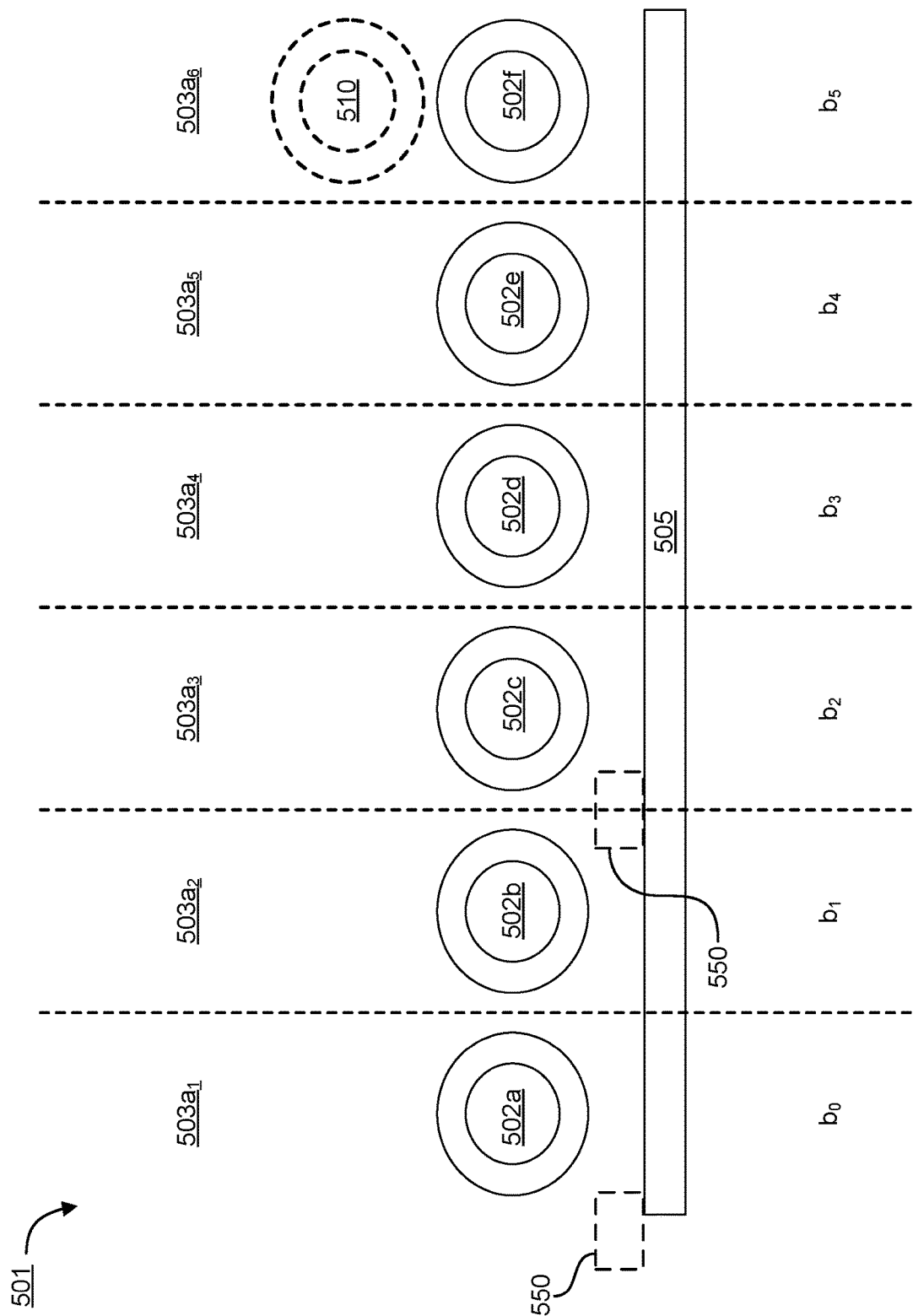
FIG. 5 illustrates another example TCAM entry in accordance with embodiments of the technology disclosed herein.

In other embodiments, a single optical filter of a TCAM cell can be configured with two resonance dips on the pass port (i.e., the input waveguide) rather than on a drop port (i.e., output match waveguide). FIG. 5 illustrates an example TCAM entry 501 in accordance with embodiments of the technology disclosed herein. The TCAM entry 501 is similar to the TCAM entries 101 discussed with respect to FIGS. 1 and 2, only with a single optical filter 502 for each TCAM cell 503 and no output match waveguide. In various embodiments, each optical filter 502 can be configured such that the filter has two resonance dips so that the optical filter 502 is capable of blocking two different resonances on the input waveguide (i.e., pass port). In various embodiments, the two wavelengths associated with a specific bit position can be spaced closely on the wavelength spectrum, and storing a wildcard value 'X' comprises reducing the resonance strength of the optical filter 502 such that both wavelengths can be blocked. Reducing the resonance strength of the optical filter 502 can enable the optical filter 502 to block both wavelengths for the respective bit position, thereby indicating a match of the wildcard value 'X' regardless of the bit value of the search word (i.e., the optical filter 502 can remove both wavelengths associated with the bit position from the input waveguide 505).

In some embodiments, an optical isolator 550 may need to be included to account for back reflection within the ring resonators. An optical isolator 550 may be disposed between each of the optical filters 502, such as the optical isolator 550 disposed between optical filters 502b and 502c in FIG. 5. In other embodiments, the optical isolator 550 may be disposed at the start of the input waveguide 505. In some embodiments, a combination of optical isolators 550 may be disposed within the TCAM entry 501. In various embodiments, the optical filter 502 may be configured with tunable back reflection utilizing one or more of the tuning components discussed above. In some embodiments, the same one or more tuning components discussed above can be used to change the refractive index of the optical filter 502 and tune the back reflection of the optical filter 502. In various embodiments, one or more coupling control components (not shown in FIG. 5) can be included to control the coupling effect within a coupling region of the optical filters 502 to enable the coupling region to be essentially turned on or off without the need to tune the resonance wavelength of the optical filter 502. In some embodiments, each optical filter 502 can have a secondary optical filter 510. The secondary optical filter 510 can be disposed such that the optical filter 502 is optically coupled to the input waveguide 505 and the secondary optical filter 510, but the secondary optical filter 510 is not coupled to the input waveguide 505. As illustrated in FIG. 5, the secondary optical filter 510 can be disposed above the optical filer 502f. The coupling between the secondary optical filter 510 and the optical filter 502f is tunable. As there is no reflection in the optical filter 502f and the secondary optical filter 510, no optical isolators 550 are required in such embodiments.

As shown in FIG. 5, each optical filter 502 is configured to remove a first wavelength, a second wavelength, or both from the optical search signal on the input waveguide 505 (i.e., block the wavelengths). In such embodiments, a photodetector (not shown in FIG. 5) can be optically coupled to the input waveguide 505. When no light is detected on the photodetector (meaning that all of the wavelengths of the optical search signal is removed by the optical filters 502), a match is indicated, similar to the scheme discussed above. Rather than serving as an add/drop optical filter, the optical filters 502 discussed with respect to FIG. 5 serve as a pass-through filter. In some embodiments, the optical filters 502 may comprise coupled ring resonators, where a bottom ring resonator is disposed between a top ring resonator and the input waveguide 505. The coupled ring resonators can be configured with tunable coupling to provide a similar effect as the pass-through optical filters depicted in FIG. 5. In some embodiments, the coupled ring resonators can eliminate back reflection and not require the use of isolators to address back reflection.

The TCAM search functionality discussed with respect to FIGS. 1-5 utilizes wavelength division multiplexing, assigning each bit position of a search word to a different wavelength of a multi-wavelength optical signal. This enables comparison between the search word and each TCAM entry in parallel. In such embodiments, each search word for which a search is to be made is processed sequentially through the TCAM bank. In various embodiments, two search words may be processed in parallel if the number of TCAM entries of the TCAM bank is doubled, each stored word being stored in two TCAM entries. In this way, each search word can have its bits associated with a different set of wavelengths, meaning that for a specific bit position four wavelengths would be associated. Each signal encoded with one search word is coupled to the input waveguides of a first set of the TCAM entries and each signal encoded with the second search word is coupled to the input waveguides of the second set of TCAM entries, each set of TCAM entries storing the same search words with optical filters tuned to a different set of wavelengths for the bit position. To increase the number of parallel searches possible there must be an equal number of TCAM entries such that each encoded word has its own set of TCAM entries (e.g., to search four words in parallel, four sets of TCAM entries would be required).

In some embodiments, a plurality of search words can be searched using the same hardware. A TCAM can be implemented using a hardware matrix multiplier configured to perform matrix-vector multiplication in the optical domain, such as the hardware matrix multiplier disclosed in U.S. Pat. No. 10,367,590, issued Jul. 30, 2019, hereby incorporated herein by reference in its entirety. Matrix multiplication can be performed using circuitry that operates on optical signals, where values are encoded within the optical signals as different amplitudes and/or phases. Amplitude and/or phase changes caused by materials and interactions between signals (e.g., constructive and destructive interference) may be used to perform operations on the values encoded in the signals.

The TCAM can be represented as $$y = Mx, \quad (1)$$

where x is a vector representing one TCAM input bit, the vector comprising two binary elements, M is the optical storage memory bank of the TCAM, each element being a binary element, and y is the output vector representing the matching result, where each dimension of the vector y is the matching result for one TCAM entry (i.e., a stored word), where a zero value indicates a match. The matrix M can be implemented optically through singular value decomposition as $$M = U\Sigma V, \quad (2)$$

where U and V comprise unitary matrices having size (m×m) and (n×n), respectively, and Σ is an (m×n) diagonal matrix. In various embodiments, the unitary matrices U and V and the diagonal matrix Σ can be implemented using optical beam splitters, phase shifters, interferometers (e.g., MZIs), or add/drop ring resonators, optical attenuators, among other optical filters, or a combination thereof.

Figure 6:
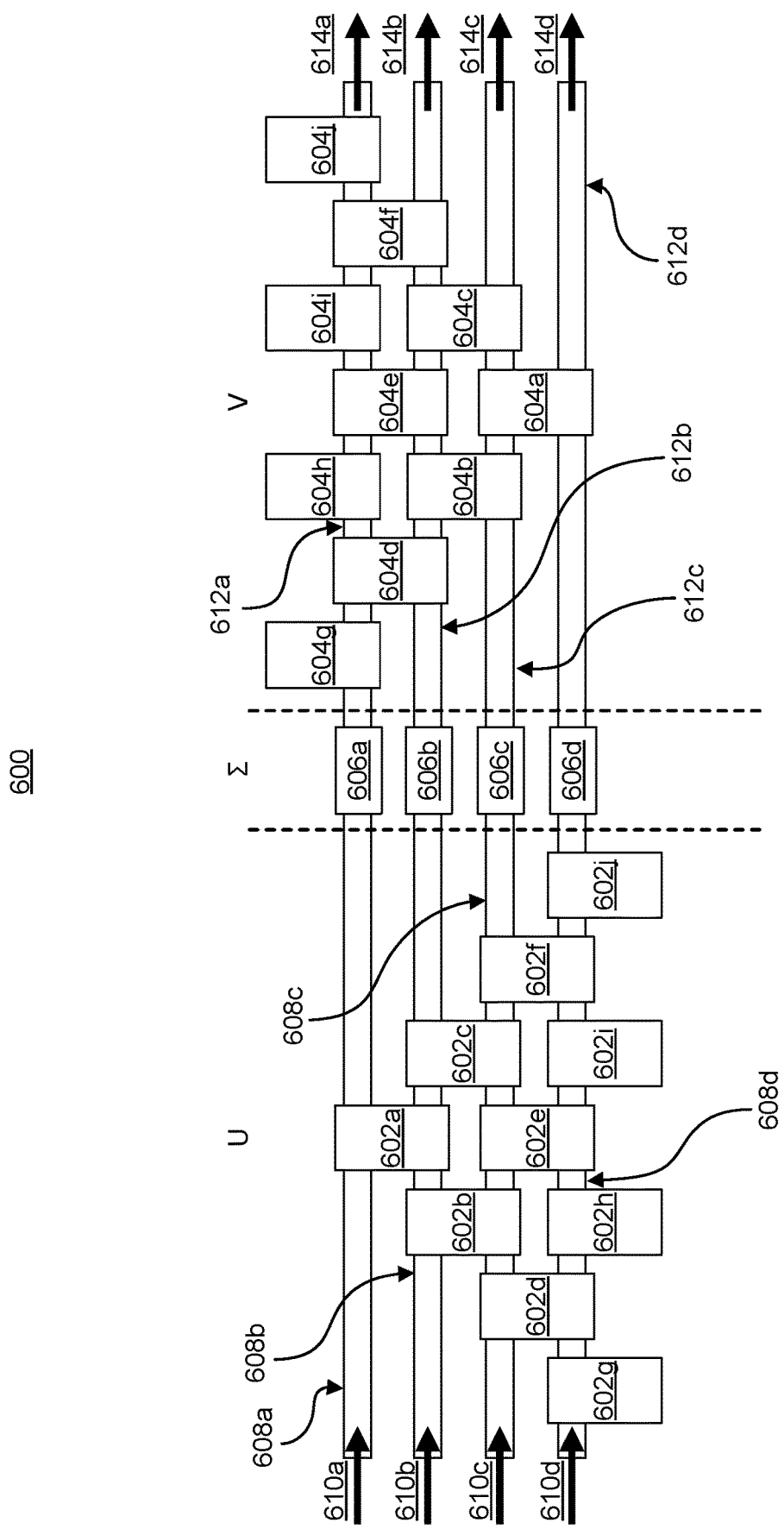
FIG. 6 illustrates an example hardware matrix multiplier in accordance with embodiments of the technology disclosed herein.

FIG. 6 illustrates an example hardware matrix multiplier 600 in accordance with embodiments of the technology disclosed herein. The example hardware matrix multiplier 600 is provided for illustrative purposes only and should not be interpreted as limiting the scope of the technology only to the disclosed embodiment. For ease of discussion, the hardware matrix multiplier 600 of FIG. 6 includes a four waveguide mesh to explain the technology of the present disclosure. Although only four rows of waveguides are depicted in the mesh of FIG. 6, the size of the mesh in other embodiments may include a plurality of rows of waveguides configured to implement the matrix M discussed above. The hardware matrix multiplier 600 is functionally similar to the optical search memory banks 100, 300 discussed above with respect to FIGS. 1-5, but rather than incoherent addition of signals to indicate a mismatch (i.e., each mismatched bit in the output signal is a different wavelength) the hardware matrix multiplier 600 performs coherent addition of mismatched bits all having the same wavelength.

As shown in FIG. 6, the hardware matrix multiplier 600 is configured to implement the matrix M of equation 2, comprising a first unitary matrix U, a diagonal matrix I, and a second unitary matrix V. In various embodiments, the first unitary matrix U and the secondary matrix V can be implemented as a plurality of optical filters 602a-j, 604a-j, respectively. In various embodiments, the optical filters 602, 604 may be multipath interferometers, lattice filters, ring resonators, among others.

The first unitary matrix U can comprise a plurality of input waveguides 608a-d (generally, "the input waveguide 608," collectively, "the input waveguides 608") in various embodiments. In various embodiments, the input waveguides 608 can be similar to the input waveguides discussed above with respect to FIGS. 1-5. Each of the input waveguides 608 can be configured to receive an input bit position signal 610a-d (generally, "the input bit position signal 610," collectively, "the input bit position signal 610"). Each input waveguide 608 can be associated with a specific bit position of a search word, and each input bit position signal 610 is encoded with the bit value at the specific bit position of the search word. Table 5 shows how the encoding of the search word can be performed in some embodiments.

TABLE 5

| Bit Value | Bit Channel (Input 1, Input 2) |
|---|---|
| 1 | (A, 0) |
| 0 | (0, A) |
| X | (0, 0) |

As shown in Table 5, each bit is assigned a bit channel, the bit channel including a set of input waveguides 608 of the hardware matrix multiplier 600. Amplitude A indicates that there is light at the wavelength at an amplitude A on the associated input waveguides (Input 1 and Input 2). For example, a bit value of logical '1' would be encoded by having a wavelength of amplitude A coupled to the first input waveguide (Input 1) of the associated bit position and omitting a wavelength of the wavelength on the second input (Input 2). Similar to the embodiments discussed above with respect to FIGS. 1-5, the hardware matrix multiplier utilizes two optical elements to encode each bit of a search word. Instead of utilizing two sets of wavelengths as used in the embodiments of FIGS. 1-5, the hardware matrix multiplier of FIG. 6 is encoded such that the first input waveguide and the second input waveguide each are associated with a bit value. This encoding is related to the initial input waveguide 608 on which the input bit position signals 610 enter the hardware matrix multiplier 600, and it should be understood that the specific signals may traverse the hardware matrix multiplier 600 over different waveguides within the first unitary matrix U, depending on the results of operations performed by each optical filter 602.

Although discussed with respect to amplitude encoding, the encoding can also be implemented using different phases of light. As a non-limiting example, each optical filter 602 can comprise a tunable phase shifter. For a logic '1' light of a first phase can be included in the input signal and light of a second phase can be omitted, for a logic '0' light of a second phase can be included in the input signal and light of the first phase can be omitted, and for a wildcard value 'X' light of a third phase can be included in the input signal or no light can be included in the input signal. Where the tunable phase shifter is tuned to pass light of the first phase a mismatch occurs when light of the first phase is included in the input signal.

As the input bit position signals 610 traverse the hardware matrix multiplier 600, a plurality of first optical filters 602 of the first unitary matrix U, a plurality of optical modulators 606 of the diagonal matrix I, and a plurality of second optical filters 604 of the second unitary matrix V apply one or more functions to the bit position signals 610 corresponding to each TCAM word stored in the hardware matrix multiplier 600 in various embodiments. The optical filters and optical modulators perform matrix multiplication, implementing equation 1 discussed above. In various embodiments, the optical filters 602, 604 and optical modulators 606 can be configured to apply a different operation based on the amplitude detected on a respective input waveguide associated with the respective filter 602, 604 and modulator 606. In various embodiments, the first unitary matrix U and the second unitary matrix V can comprise triangular meshes of optical filters 602, 604, respectively, while in other embodiments rectangular meshes may be used. The optical filters 602, 604 and/or the optical modulators 606 may comprise one or more different types of optical filters, including but not limited to Mach-Zehnder interferometers (MZIs), beam splitters, phase shifters, among others. In various embodiments, the first unitary matrix U and the second unitary matrix V may have different sizes (i.e., including a different number of optical filters and/or input waveguides), while in some embodiments the two matrices may have the same size. In various embodiments, all of the TCAM words can be stored in the first unitary matrix U, diagonal matrix I, and second unitary matrix V using the same wavelength, with the first TCAM word being stored on a first row, a second TCAM word stored on a second row of the hardware matrix multiplier, and so on. Each of the optical filters 602, 604, and modulators 606 can be tuned to achieve the proper interference by one or more tuning components configured to change the resonance, phase, length, or other characteristic of the optical filters, such as the tuning components discussed above with respect to FIGS. 1-5.

Table 6 illustrates how the encoding is implemented in the hardware matrix multiplier 600 to determine matches and mismatches between bits of search words and stored TCAM words.

TABLE 6

| Input (Input 1, Input 2) | Bit Channel (Input 1, Input 2) | Match/Mismatch (passed/blocked) |
|---|---|---|
| 1/(1, 0) | 1/(block, pass) | Match (blocked) |
| 0/(0, 1) | 0/(pass, block) | Match (blocked) |
| 1/(1, 0) | 0/(pass, block) | Mismatch (passed) |
| 0/(0, 1) | 1/(block, pass) | Mismatch (passed) |
| X/(0, 0) | ANY | Match (blocked) |

As shown in Table 6, the bit channel associated with the specific bit is encoded such that no light for that bit position of that search word is passed to the associated output waveguide 614 of a TCAM entry (i.e., stored word) if the search word bit matches the TCAM entry bit at that same position. To store a wildcard value 'X' neither light provided to the associated input waveguide 602 of the bit channel is passed through the multiplier 600 to the associated output waveguide 614 of the associated TCAM entry. Referring to FIG. 6, the non-limiting example depicted comprises two bit channels. In some embodiments, the bit channel may be configured such that two neighboring input waveguide 602 comprise a bit channel (e.g., bit channel $b_0$ includes input waveguides 602a, 602b). In other embodiments, the input waveguides 602 of a bit channel may be separated by one or more other input waveguides 602 (e.g., bit channel $b_2$ includes input waveguides 602a, 602d).

In various embodiments, each output waveguide 612a-d (generally, "the output waveguide 612," collectively, "the output waveguides 612") of the hardware matrix multiplier 600 is associated with a specific TCAM word stored in the hardware matrix multiplier 600. For example, the first output waveguide 612a is configured to output a match result signal 614 associated with a first TCAM stored word. If light of a specific wavelength is detected on the output waveguide 612, a mismatch is indicated between the first TCAM stored word and the search word encoded on that wavelength. If no light at that wavelength is detected on the output waveguide 612a, a match is indicated between the TCAM stored word and the search word. In various embodiments, a search word is input into the hardware matrix multiplier 600 vertically, with each bit position associated with sets of input waveguides 608, whereas each output waveguide 612 represents a respective TCAM stored word. Hence, the same hardware is utilized to search all of the TCAM stored words in parallel, reducing the number of components necessary to form a TCAM bank.

In various embodiments, the hardware matrix multiplier 600 can be configured such that a single wavelength is used. That is, all of the TCAM stored words can be encoded in the hardware matrix multiplier 600 using the same wavelength, and the search word would also be encoded using that wavelength to enable the interference required to perform the search. Therefore, although all of the TCAM stored words can be implemented in the same hardware, thereby reducing the number of components necessary, each search word would still need to be input sequentially. In some embodiments, the hardware matrix multiplier 600 can be configured such that multiple wavelengths can be utilized, allowing more than one search word to be input at a time. In this manner, not only can the TCAM stored words be searched in parallel (i.e., a search word is compared against all of the TCAM stored words at the same time), but multiple TCAM searches can be conducted in parallel (i.e., multiple search words can be input into the hardware matrix multiplier 600).

In such embodiments, each optical filter 602, 604 and modulator 606 can be implemented as a wavelength-dependent optical component capable of applying an operation based on the wavelength. As a non-limiting example, each optical filter 602, 604 and optical modulator 606 can be implemented as a lattice filter. The lattice filters can be configured such that a first set of TCAM stored words is encoded using a first wavelength, a second set of TCAM stored words is encoded using a second wavelength, and so on. Accordingly, each input bit position signal 610 can comprise a multi-wavelength optical signal, wherein each search word is associated with a specific wavelength (i.e., the first wavelength of the first set of TCAM stored words, the second wavelength of the second set of TCAM search words, and so on). In such embodiments, in addition to performing the comparison between the bit value of a search word and of a TCAM stored word, each lattice filter 602, 604, 606 can also compare a different set of the plurality of sets of TCAM stored words to a different search word of a plurality of search words. In some embodiments, each set of TCAM stored words can comprise the same TCAM stored words. In some embodiments, one or more of the sets of TCAM stored words may comprise different TCAM stored words compared to at least one other set of TCAM stored words.

For example, a first set of TCAM stored words can store the words '01011,' 1XX01,' and 'X0100,' while a second set of TCAM stored words can store the words '11X11,' '011X0,' and '00001.' In such embodiments, one search word can be compared against the first set of TCAM words and a second search word can be compared against the second set of TCAM words. In some embodiments, a search word can be encoded using two or more wavelengths, such that the search word is compared against both the first set of TCAM words and a second set of TCAM words in parallel, increasing the number of TCAM stored words against which a single search word can be compared.

Figure 7:
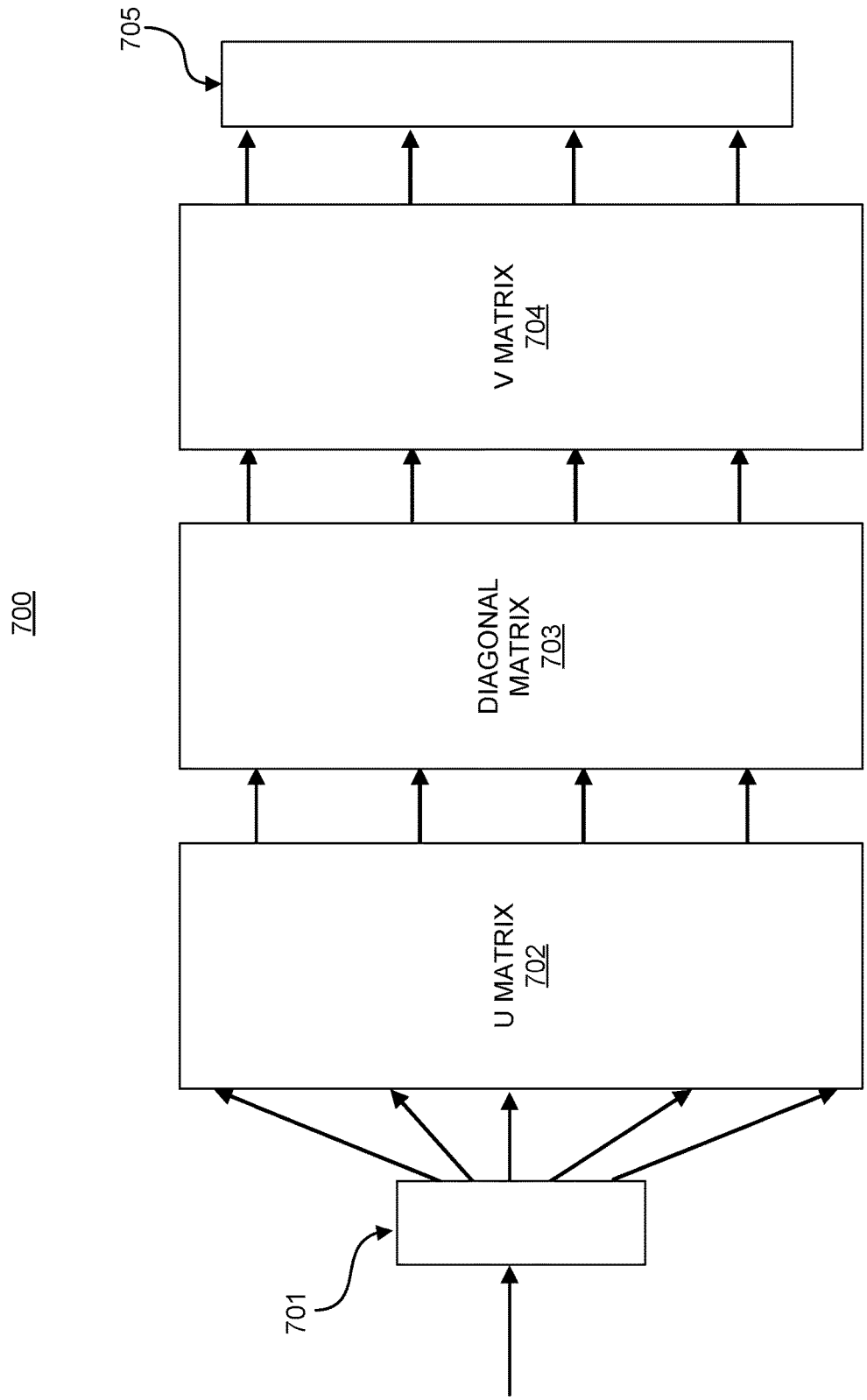
FIG. 7 is an example TCAM search engine in accordance with embodiments of the technology disclosed herein.

FIG. 7 illustrates an example TCAM search engine 700 in accordance with embodiments of the technology disclosed herein. The example TCAM search engine 700 is provided for illustrative purposes only and should not be interpreted as limiting the scope of the technology disclosed herein. FIG. 7 depicts an optical implementation of the singular value decomposition of equations 1 and 2 using the example hardware matrix multiplier 600 as discussed with respect to FIG. 6. In various embodiments, the TCAM search engine 700 can be configured such that the TCAM stored words are stored using the same wavelength, and in other embodiments the TCAM search engine 700 can be configured using wavelength-dependent optical filters that can be tuned to store sets of TCAM stored words, each set associated with a different wavelength. As shown in FIG. 7, one or more search words are received by a search input 701. In various embodiments, the search words may be received over an electrical trace (e.g., from a processor or application) while in other embodiments the search words may be received over an optical connection. In various embodiments, the search input 701 can be configured to receive the search words and associate one of a plurality of wavelengths with each search word. In some embodiments, when optical search signals are received optically, the search input 701 can detect the wavelength on which the search word was received and ensure that there is no overlap with the wavelengths assigned to the other search words. In various embodiments, one or more optical buffers (not shown in FIG. 7) may be included within the search input 701 and configured to buffer the one or more received search words such that all of the bits of the respective search word can be encoded in parallel. The bits of each search word would be received sequentially. The one or more buffers are configured such that each bit position of the search word is delayed for an amount of time sufficient to enable the search input 701 to receive all of the bit positions of the search word and align them in parallel.

After assigning each search word a wavelength, the search input 701 encodes the respective search word using the assigned wavelength. The encoding can be performed in a similar manner as that discussed above with respect to FIG. 6 and Table 5. In various embodiments, the search input 701 can be configured to encode the bit value on a set of input signals, each sent to one of the set of input waveguides of matrix U 702 (i.e., the bit channel for the bit position). The signals traverse the U matrix 702, the diagonal matrix 703, and the V matrix 704 as discussed above with respect to FIG. 6, with matrix multiplication occurring therein. For each search word that is input to the example TCAM search engine 700, if at least one mismatch occurs between a bit of the search word and a bit of a TCAM stored word, light will be present on the output of the V matrix 704 associated with the respective TCAM stored word. If more than one mismatch occurs, each mismatch will add more light to the output waveguide for the respective TCAM stored word. The light identifying each mismatched bit is coherently added as plurality of input signals representing a search word traverses the unitary matrices 702, 704 and the diagonal matrix 703. Accordingly, the output signal of the wavelength on which the search word was encoded represents all of the mismatches that occurred. In various embodiments, the photodetector array 705 is configured to determine whether a match or mismatch has occurred between any of the search words and any of the TCAM stored words based on whether any light is detected on the output waveguide associated with each respective TCAM stored word. In various embodiments, the photodetector array 705 may include circuitry (e.g., a photodetector) configured to identify the TCAM store word for which a match is detected and transmit a match indication to another component in the processing line. The another component (e.g., a laser or an analog-to-digital converter (ADC)) can be configured to generate a memory address associated with the matched TCAM stored word. Based on the received combined signal, the detection component may generate a memory address associated with the matched TCAM stored word. Where a single wavelength is utilized in the TCAM search engine 700, the photodetector array 705 may be directly optically coupled to the output waveguides of the V matrix 704. Where multiple wavelengths are utilized in the TCAM search engine 700, a demultiplexer may be disposed between the output waveguides of the V matrix 704 and the photodetector array 705. The demultiplexer can separate light of different wavelengths on a respective output waveguide into a plurality of output signals, and each output signal can be optically coupled to a respective photodetector of the photodetector array 705 (i.e., each output waveguide of the V matrix 704 can be associated with a plurality of photodetectors of the photodetector array 705).

In various embodiments, the TCAM search engine 700 can determine the degree of mismatch between the search word and the TCAM stored word, in addition to determining if a match has occurred. In various embodiments, the TCAM search engine 700 can be configured to use the amplitude of a detected output signal to determine how much of a mismatch there was between the words. The more bits that were mismatched, the larger the amplitude of the output signal after coherent addition. This change in level can be used to determine how large the mismatch was. In various embodiments, the encoded signal can be programmed such that, for each mismatched bit, a detectable increase in the amount of light at the photodetector array 705. The photodetector array 705 can comprise circuitry configured to register the detectable increase and determine the number of mismatched bits of that search word to the TCAM stored word. The number of mismatched bits provides an indication of the similarity between the respective search word and the respective TCAM stored word associated with that output.

Figure 8:
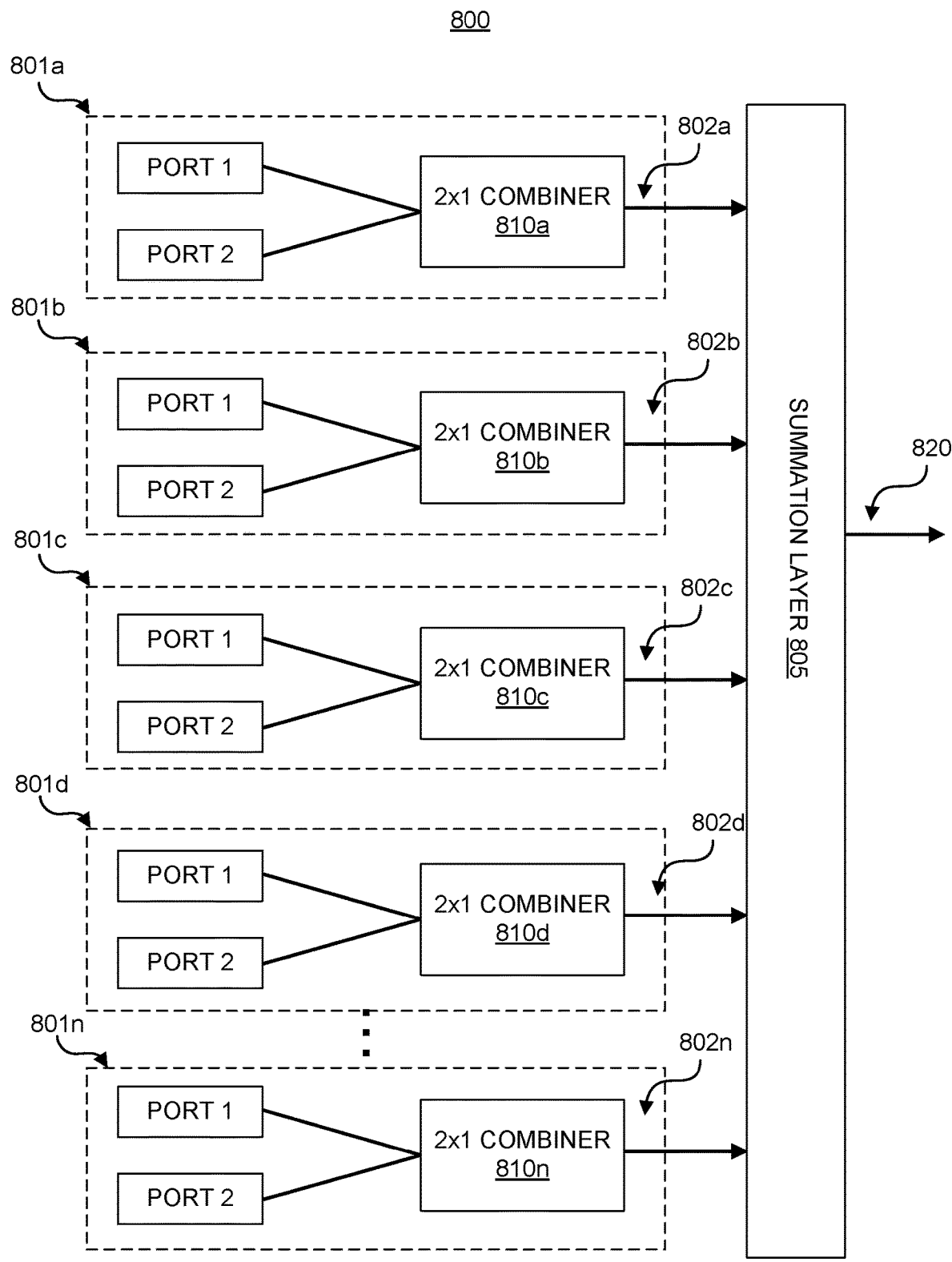
FIG. 8 illustrates an example wildcard-enabled TCAM entry in accordance with embodiments of the technology disclosed herein.

In various embodiments, single-wavelength, coherent TCAM operation (like that discussed above with respect to FIGS. 6 and 7 can be implemented without the use of the completely reconfigurable hardware matrix multiplier 600. FIG. 8 illustrates an example wildcard-enabled TCAM entry 800 in accordance with embodiments of the technology disclosed herein. The example wildcard-enabled TCAM entry 800 is provided for illustrative purposes only and should not be interpreted as limiting the scope of the technology to only the depicted embodiment. The wildcard-enabled TCAM entry 800 provides another approach to performing coherent TCAM searching similar to FIGS. 6 and 7 but with a different architecture. As shown in FIG. 8, the wildcard-enabled TCAM entry 800 comprises a plurality of TCAM cells 801a-n (generally, "the TCAM cell 801," collectively, "the TCAM cells 801") of a stored word. Each TCAM cell 801 comprises two ports: Port 1 and Port 2. Each port (Port 1, Port 2) can comprise an atomic unit, such as an MZI, ring resonators, or other filter types. In some embodiments, the MZI could be a 1×1 MZI, while in other embodiments the MZI may be a 2×2 MZI where one of the two outputs and one of the two inputs are ignored. Table 7 shows the encoding of the input amplitudes to represent each bit

TABLE 7

| Bit Value | Optical Search Signal (Port 1, Port 2) |
|---|---|
| 1 | Port 1 |
| 0 | Port 2 |
| X | No light |

As shown in Table 7, each bit position of the search word can be encoded based on the input port on which an amplitude is detected. Similar to the encoding above, logical '1' is encoded based on an amplitude at a first input port (Port 1) and a logical '0' is encoded based on an amplitude at a second input port (Port 2), with no amplitude on the opposing input port. In order to encode a "don't care" bit ('X'), neither input port has an amplitude.

Based on which of Port 1 or Port 2 is passed/blocked, a wildcard value 'X' can be represented by the TCAM cell 801 in addition to a logical '0' or a logical '1'. Table 8 illustrates the encoding scheme utilizing the wildcard-enabled TCAM entry 800.

TABLE 8

| Input (Port 1, Port 2) | TCAM Cell (Port 1, Port 2) | Match/Mismatch (passed/blocked) |
|---|---|---|
| 1/(A, 0) | 1/(block, pass) | Match (blocked) |
| 0/(0, A) | 0/(pass, block) | Match (blocked) |
| 1/(A, 0) | 0/(pass, block) | Mismatch (passed) |
| 0/(0, A) | 1/(block, pass) | Mismatch (passed) |
| X/(0, 0) | ANY | Match (blocked) |
| ANY | X/(block, block) | Match (blocked) |

The output from each port (Port 1, Port 2) within a TCAM cell 801 can be combined in a 2×1 combiner 810a-n (generally, "the 2×1 combiner 810," collectively, "the 2×1 combiners 810"). The 2×1 combiner 810 is configured to combine the outputs of Port 1 and Port 2 to form the cell output 802a-n (generally, "the cell output 802," collectively, "the cell outputs 802"), indicating whether the TCAM cell 801 matches the value at the respective bit position of the search word. Each cell output 802 from the TCAM cells 801 can be combined into a single match signal 820 by a summation layer 805 in various embodiments. The summation layer 805 may comprise an N×1 combiner, where N equals the number of TCAM cells 801 making up a stored word. In various embodiments, the summation layer 805 may be implemented as dedicated multi-mode interferometers (MMIs), star couplers, MMI trees, a tunable MZI lattice mesh, among others. If light is detected on the match signal 820 by a photodetector (not shown) associated with the wildcard-enabled TCAM entry, a mismatch is indicated for that word. If no light is detected on the match signal 820 (e.g., there is no match signal 820) by a photodetector (not shown), a match is indicated. In some embodiments, a gain element (not shown in FIG. 8) may be coupled to the output of the summation layer 805 to increase the strength of the match signal 820.

Figure 9:
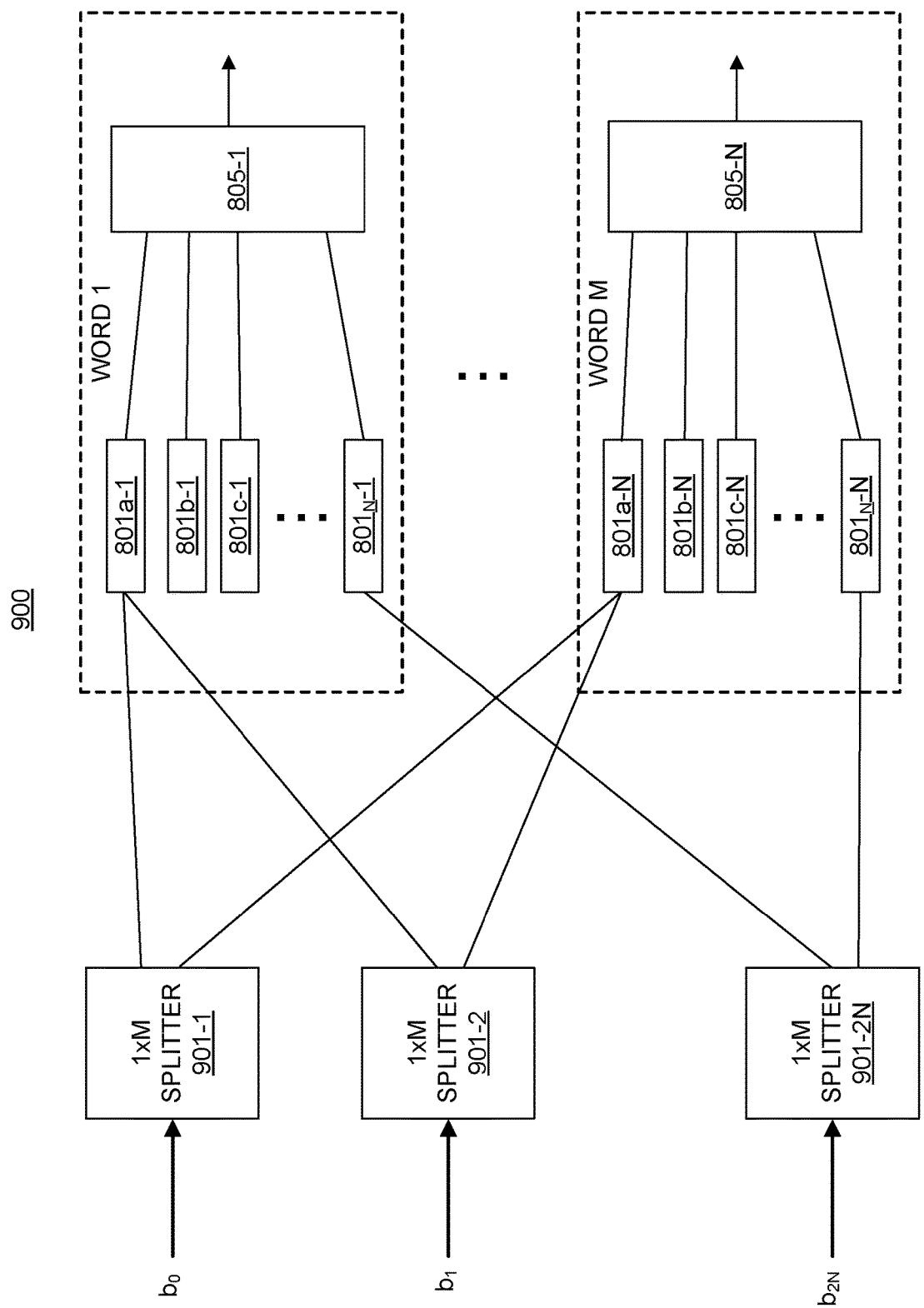
FIG. 9 illustrates an example optical search system in accordance with embodiments of the technology disclosed herein.

FIG. 9 illustrates an example optical search system 900 in accordance with the technology disclosed herein. The optical search system 900 is provided for illustrative purposes only and should not be interpreted as limiting the scope of the technology to only the depicted embodiment. FIG. 9 includes an optical search memory bank comprising M TCAM words. In the illustrated example, each search word of N bits is represented using 2N bits, to allow to include wildcards in the search word. In various embodiments, each bit position of the original N-bit search word is associated with a wavelength, similar to the manner discussed with respect to FIGS. 6-7 above. A search input (not shown in FIG. 9) can be configured to map the N-bit search word to a 2N-bit search word. Each bit position in the original N-bit search word is represented by two bits within the 2N-bit search word, to allow the encoding of wildcards. The search input of the optical search system 900 can be configured to split the N-bit search word into two optical search signals for each bit position (i.e., a total of 2N optical search signals are generated).

Each 2N-optical search signal may have a dedicated 1×M splitters 901-1 to 901-2N (generally, "the 1×M splitter 901," collectively, "the 1×M splitters 901"). In various embodiments, the 1×M splitters 901 may be implemented using a dedicated tunable MZI lattice mesh by creating a 2N×2NM matrix. Each 1×M splitter 901 is configured to split the received optical search signal into M versions, and can output each of the plurality of N-bit input signals to a word of the plurality of words in the optical search system 900. As shown in FIG. 9, the optical search system 900 includes a bank of stored words comprising Word 1 to Word M. As an example, the first bit $b_0$ of the 2N-bits is split into a plurality of versions by the 1×M splitter 901-1, with each output going to the corresponding TCAM cell (e.g., 801a-1 of WORD 1) of each TCAM word. As depicted in FIG. 9, one version of the first 2N-bit $b_0$ is sent to TCAM cell 801a-1 of WORD 1 and another version is sent to TCAM cell 801a-N of WORD M. Each of the 2N-bits $b_{2N}$ are split amongst the plurality of TCAM words to enable multiple words to be searched in parallel. Each TCAM cell 801 is configured to receive two M-bit input signals, one associated with each port (Port 1, Port 2). The optical search system 900 can perform the search in the manner discussed with respect to FIG. 8. In various embodiments, the added output signal from each summation layer 805 can be transmitted to an encoder (not pictured in FIG. 9) configured to generate a memory address associated with each TCAM word for which a match was detected. In various embodiments, each TCAM word (e.g., Word 1) can output the combined optical output signal, an indication of a match or mismatch, or a combination of both. In some embodiments, a multiplexer (not shown in FIG. 9) can be coupled to the output of each TCAM word and configured to multiplex any combined optical signals onto a multi-wavelength signal for transmission to another component or device. In embodiments wherein each M-bit input signal comprises a multi-wavelength optical signal, a demultiplexer may be optically coupled between the output of each word of the word bank (i.e., Word 1 to Word M). Similar to the demultiplexer discussed above with respect to FIGS. 6 and 7, the demultiplexer separates any output signal from a given word into individual wavelengths, and each wavelength can be routed to a respective photodetector.

Figure 10:
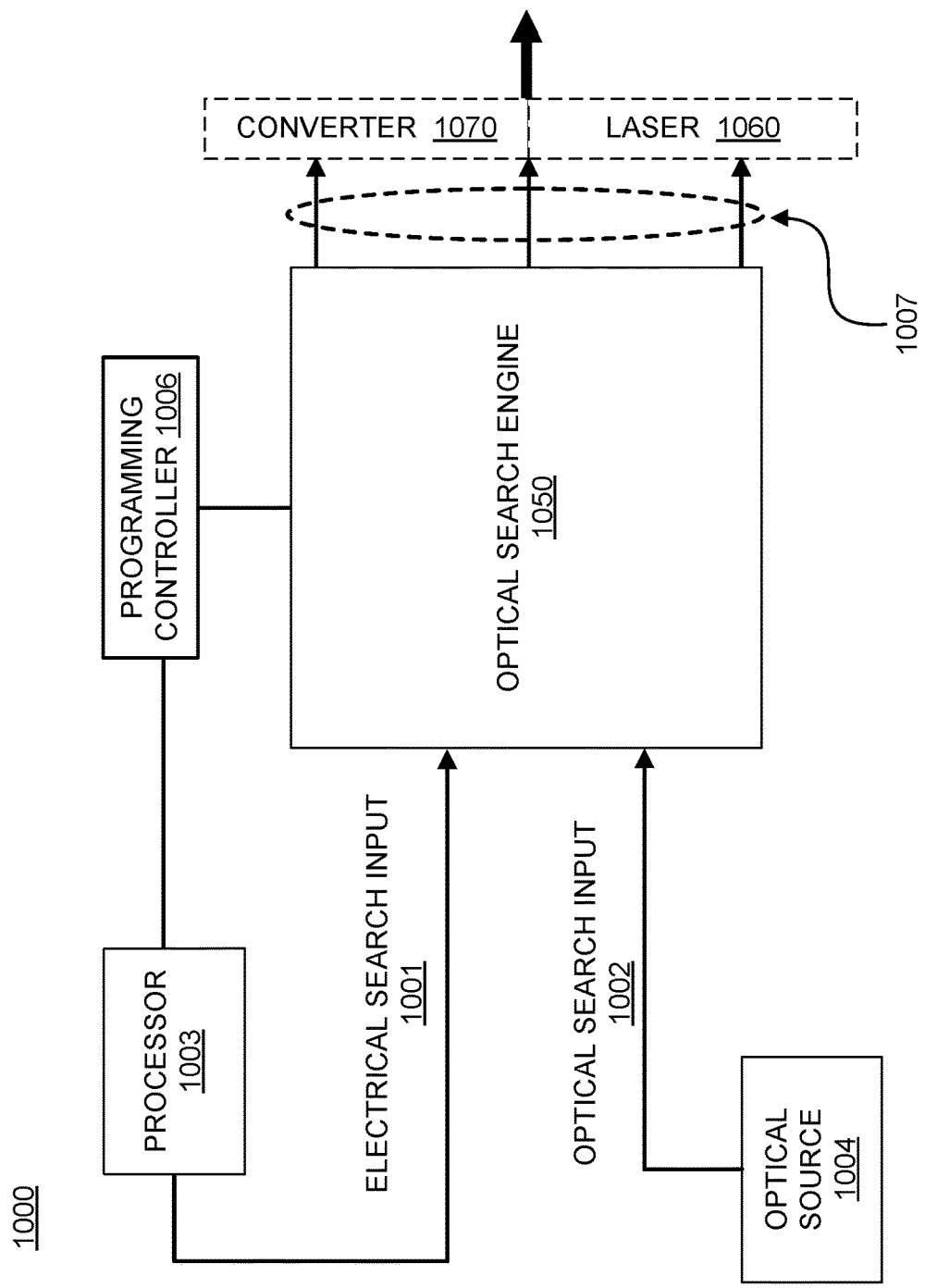
FIG. 10 illustrates an example computing device in accordance with embodiments of the technology disclosed herein.

The optical search systems discussed with respect to FIGS. 1-9 can be implemented within a TCAM component of a device, increasing the speed and efficiency of the search compared to traditional TCAMs. FIG. 10 illustrates an example computing device 1000 in accordance with embodiments of the technology disclosed herein. The example computing device 1000 is provided for illustrative purpose and should not be interpreted as limiting the scope of the technology only to the depicted embodiment. The example computing device 1000 may include more or fewer components in various embodiments. When common references are used between figures, it should be interpreted that all descriptions associated with such reference is applicable to all instances of the reference unless otherwise stated.

As shown in FIG. 10, the computing device 1000 can comprise a processor 1003. In various embodiments, the processor 1003 can be one or more of a general purpose processor (GPU), an application specific integrated circuit (ASIC), a field programmable gate array (FPGA), or other computer processor device known in the art. In various embodiments, the processor 1003 can comprise a co-processor configured to control operation of the TCAM search functionality of the computing device 1000. In some embodiments, the processor 1003 can be configured to send an electrical search word to and optical search engine 1050. In various embodiments, the optical search engine 1050 can be configured to implement the embodiments discussed above with respect to FIGS. 1-9. One or more applications executed by the processor 1003 may request access to a portion of memory within the same network as the computing device 1000 by submitting a search word electronically of the electrical search input line 1001. The optical search engine 1050 can encode the search word on the optical search signals, as discussed with respect to FIGS. 1-9. In various embodiments, the search word may be submitted to the optical search engine 1050 optically over the optical search input line 1002 from an optical source 1004. In various embodiments, the optical search engine 1050 may comprise one or more buffers (not shown in FIG. 10) configured to buffer each of the one or more search words. In various embodiments, the search words may be sequentially compared against the stored words within the optical search engine 1050, the one or more buffers used to buffer the search words until the respective search word's turn to be compared with the stored words.

In various embodiments, the optical source 1004 may comprise an output from an optical transceiver (not shown in FIG. 10) of the computing device 1000. The optical transceiver may be configured to receive an optical signal encoded with the search word from one or more other devices connected to the computing device 1000. In some embodiments, the optical source 1004 can comprise an optical fiber or other optical transmission medium within the computing device 1000 and connected to one or more other components within the computing device and/or to the interior output of a faceplate connector. The optically-received search word over the optical search input 1002 can be multiplexed into the plurality of optical search signals like that discussed with respect to FIGS. 1-9.

In various embodiments, the processor 1003 can be communicatively coupled to the programming controller 1006. As discussed with respect to FIG. 1, the programming controller 1006 can be configured to program the plurality of TCAM cells within the optical search engine 1000 such that the optical filters are tuned to store a particular logical value. In various embodiments, the processor 1003 may send a word to be stored to the programming controller 1006, which can then determine how the optical filters are to be tuned to store the received word. In some embodiments, the processor 1003 and the programming controller 1006 may be the same component. In some embodiments, the programming controller 1006 can be configured to receive instructions for the tuning of the optical filters of the optical search engine 1050 for each word to be stored from the processor 1003.

After performing the search, one or more output signals 1007 may be output by the optical search engine 1050. In various embodiments, the output signals 1007 can comprise one or more memory addresses in a memory component within the network and accessible by the computing device 1000, whether directly or indirectly (i.e., through another device within the network), corresponding to one or more stored words within the optical search engine 1050 that were determined to match the search word. The output signal 1007 can be sent to either a converter 1070, a laser 1060, or a combination of both. If the memory address corresponding to the matched TCAM word(s) is to be sent to an electronic component (e.g., a memory controller directly connected to the computing device 1000) to gain access to the content at the requested memory address(es), the output signal 1007 can be sent to the converter 1070, which is configured to convert the output signal into an electrical signal comprising the memory address(es). In various embodiments, the converter 1070 may comprise an analog-to-digital converter (ADC). If the output signal 1007 is to be sent optically to another entity (e.g., another computing device over an optical interconnect), the output signal 1007 can be sent to a laser 1060 configured to convert the output into an optical signal to be transmitted to another entity, such as a memory controller or another device.

Figure 11:
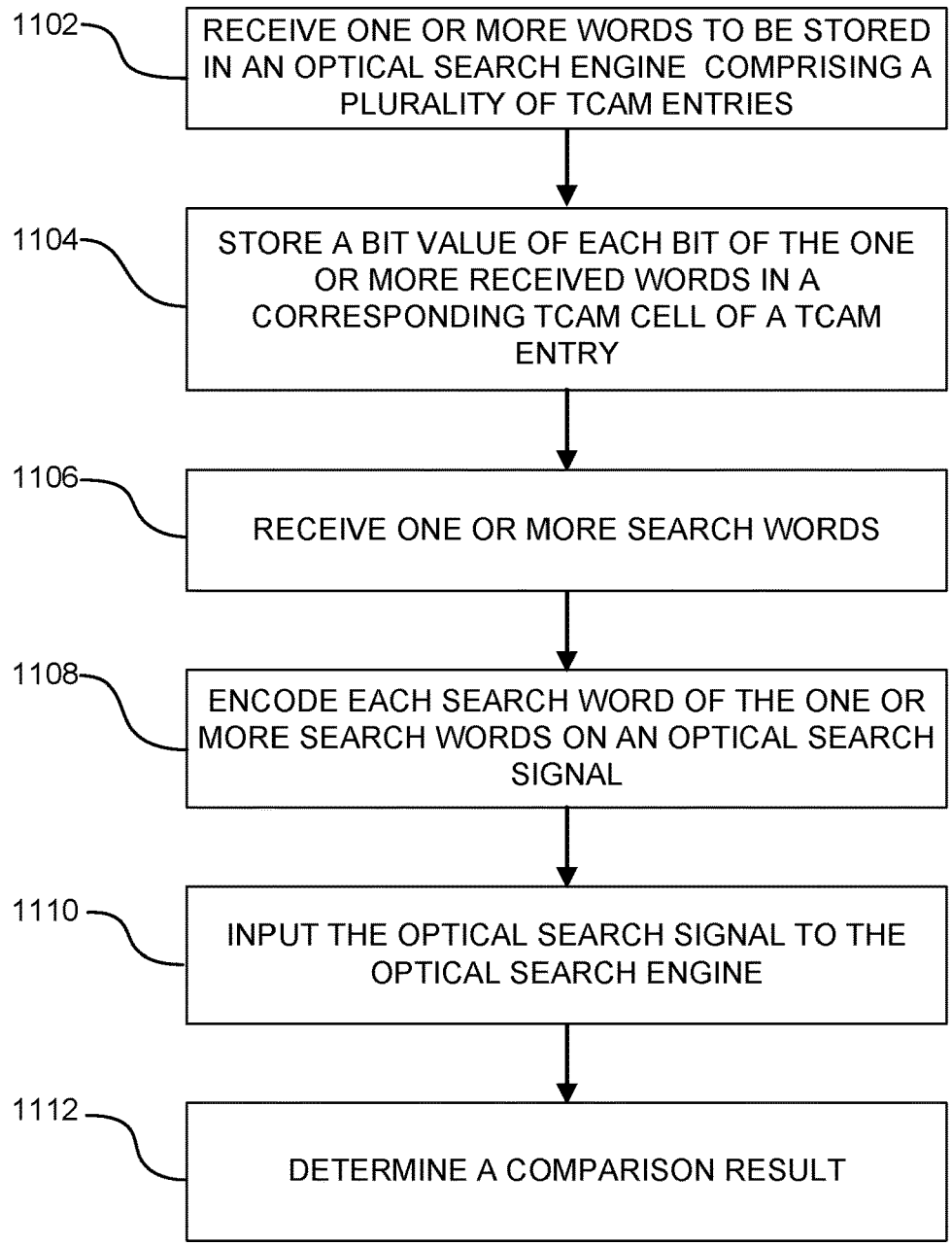
FIG. 11 is an example method in accordance with embodiments of the technology disclosed herein.

FIG. 11 is an example method 1100 in accordance with embodiments of the present disclosure. The example method 1000 is provided for illustrative purposes only and should not be interpreted as limiting the scope of the technology disclosed herein. The example method 1100 can be implemented in optical TCAMs similar to those discussed above with respect to FIGS. 1-10, to perform a ternary search. In various embodiments, the method 1100 can comprise one or more non-transitory machine-readable instructions executable by one or more processors of a computing device, and stored on a non-transitory machine-readable storage medium. At operation 1102, one or more words to be stored in an optical search engine comprising a plurality of TCAM entries are received. In various embodiments, each of the one or more words to be stored may be received by a programming controller of an optical search system. Receiving the word to be stored may occur in a manner similar to the programming discussed above with respect to FIGS. 1-10 discussed above. The one or more received words can each comprise a plurality of bits. The programming controller can be configured to control one or more tuning components connected to each of a plurality of optical filters of each of the TCAM entries. In various embodiments, the programming controller may be configured to control one or more tuning controls connected to one or more of the plurality of optical filters and configured to control the coupling of the various optical filters, such as (but not limited to) tuning the resonance wavelengths in a ring resonator-type optical filter or the path difference in each arm and the global phase shift in both arms of a multipath interferometer-type optical filter, among others. In various embodiments, the plurality of optical filters may be configured in rows, where each row represents a single TCAM entry and are configured to enable incoherent wavelength addition. In other embodiments, the optical search engine can be configured to utilize coherent addition of optical signals, wherein each of the plurality of optical filters may comprise a hardware matrix multiplier configured to implement singular value decomposition (SVD) in a manner similar to the hardware matrix multiplier discussed with respect to FIGS. 6 and 7 above. In some embodiments, the hardware matrix multiplier may be configured to store the one or more received words using the same wavelength, while in other embodiments the hardware matrix multiplier may be configured to store the one or more words using a plurality of wavelengths. In various embodiments, the optical search engine can be configured to utilize coherent addition of optical signals, wherein each of the one or more received words is stored within a plurality of TCAM cells comprising a plurality of atomic units, each atomic unit comprising one or more optical filters.

At operation 1104, each bit value of the one or more received words can be stored within a TCAM cell of a plurality of TCAM cells of a respective TCAM entry of the plurality of TCAM entries. In various embodiments, storing the bit values may be performed by the programming controller of an optical search system similar to FIGS. 1-10. In various embodiments, storing the bit value may comprise tuning using one or more tuning controls the one or more of the optical filters to change the optical characteristics of the optical filter. Non-limiting examples of stimuli include voltage, thermal, electro-magnetic, or other type of stimuli known in the art to impact the optical characteristics of optical components. In some embodiments, storing the bit value may comprise propagating one or more setting wavelengths through each optical filter to set the optical characteristics. In various embodiments, each TCAM cell can comprise two optical filters, and storing the bit value comprises setting the first optical filter to pass or block a first wavelength associated with the bit position and setting the second optical filter to pass or block a second wavelength associated with the bit position. In various embodiments, both of the optical filters can be configured to block both bit position-specific wavelengths associated with the bit position to indicate a wildcard value 'X' to be stored in the corresponding TCAM cell. In some embodiments, both the first optical filter and the second optical filter can be optically coupled to the input waveguide of the TCAM entry, while in other embodiments the first optical filter may be optically coupled to the input waveguide and the second optical filter may be optically coupled to the first optical filter. In various embodiments, each TCAM cell may comprise one optical filter, the optical filter capable of being tuned to either the first wavelength, the second wavelength, or a random wavelength associated with the bit position. In various embodiments, the set of optical filters for each bit position of the received word is configured to perform incoherent optical signal addition, while in other embodiments the set of optical filters are configured to perform coherent optical signal addition.

At operation 1106, one or more search words may be received from a search word source. The one or more search words may be received by a search input of an optical search system similar to those discussed with respect to FIGS. 1-10. In various embodiments, the one or more search words may be received as an electronic signal from one or more processors and/or applications that can access the optical search system. In some embodiments, the one or more search words may be received on an encoded optical search signal from an optical source, similar to that discussed above with respect to FIGS. 1-10. In various embodiments, the search word source may comprise a processing circuit, application, optical transceiver, or other source discussed with respect to FIGS. 1-10.

At operation 1108, each of the one or more search words can be encoded into one or more optical signals. In various embodiments, the bit value of a search word can be encoded utilizing the bit position-specific set of wavelengths associated with the respective bit position, wherein the encoded optical search signal comprises a multi-wavelength signal representing a word of the one or more search words in a manner similar to the that discussed above with respect to FIGS. 1-5 and 10. Each search word of the one or more search words can be encoded onto its own respective optical search signal. In various embodiments, a search word of the one or more search words can be encoded utilizing the same wavelength, wherein the optical search signal comprises a plurality of input signals representing the bit value in the amplitude of each input signal, in a manner similar to that discussed above with respect to FIGS. 6, 7, and 10. In various embodiments, each search word can be encoded using the same wavelength, while in other embodiments each search word can be encoded using a different wavelength of a set of wavelengths, and each input signal can comprise the associated input signal for each wavelength. In various embodiments, encoding the one or more search words may comprise mapping each N-bit search word to a 2N-bit search word, and generating a plurality of input signals for each 2N-bit position of the 2N-bit search word in a similar manner as that discussed above with respect to FIGS. 8-10.

At operation 1110, the encoded optical search signal is input to the optical search engine of TCAM stored words. In various embodiments, inputting the encoded optical search signal may comprise multiplexing the optical search signal into a plurality of input signals, each input signal comprising a copy of the optical search signal (i.e., includes the one or more wavelengths of the bit position-specific wavelengths encoded for the search word). Each of the plurality of input signals can be routed to an input waveguide of a respect TCAM entry within the optical search engine, such that the search word is compared against a plurality of TCAM entries of the optical search engine, similar to that discussed above with respect to FIGS. 1-5 and 10. Each of the encoded optical search signals encoding a search word of the one or more search words can be inputted sequentially such that each search word is compared against a plurality of the TCAM entries at a time. In various embodiments, inputting the optical search signal may comprise routing each input signal encoded to represent a bit value of one of the one or more search words to an input waveguide associated with the respective bit position of the search word, similar to the manner discussed above with respect to FIGS. 6, 7, and 10. In some embodiments, each optical search word for each search word can be encoded using the same wavelength, and can be inputted sequential such that each search word is compared against a plurality of the TCAM entries stored within the optical search engine. In other embodiments, each input signal can comprise a multi-wavelength signal with each of the one or more search words encoded as a separate wavelength such that the one or more search words can be inputted into the optical search engine in parallel. In various embodiments, inputting the optical search signal can comprise routing each of the 2N-bit input signals to a TCAM cell of a plurality of TCAM entries of the optical search engine, similar to the manner discussed above with respect to FIGS. 8-10. In various embodiments, the 2N-bit input signals may encode one search word of the one or more search words, while in other embodiments the 2N-bit input signals may encode each of the one or more search words.

At operation 1112, a comparison result is determined. In various embodiments, the comparison result may be determined by a photodetector associated with each TCAM entry. Each photodetector may be configured to sense a resultant optical signal on an output match waveguide of the respective TCAM entry. In various embodiments, one or more of the photodetectors comprises a photodiode. If no light is detected on the output match waveguide (i.e., there is no resultant optical signal), the photodetector can indicate a match between the search word and the word stored in the respective TCAM entry. If light is detected on the output match waveguide (i.e., there is at least one wavelength of the multi-wavelength input signal in the resultant optical signal), the photodetector can indicate a mismatch between the search word and the word stored in the respective TCAM entry. In various embodiments, the comparison result me be determined by one or more optical detectors connected to one or more combiners or multiplexers and configured to detect coherently added optical signals, similar to the manner discussed above with respect to FIGS. 7-9. In some embodiments, a demultiplexer may be disposed between the output waveguides of the optical search engine and the photodetectors to separate an output signal encoded with multiple wavelengths such that light of each wavelength can be routed to a respective photodetector.

Implementing one or more of the embodiments discussed herein provides a massive reduction in the amount of energy consumed to perform a ternary search using a TCAM. By eliminating the need for multiple optical-to-electrical conversions, the amount of energy consumer is lowered due to the lower power consumption associated with the passive optical components of the embodiments. Moreover, the latency for a parallel ternary search in reduced due to the faster search capability within the optical domain. This can increase the throughput for key applications including data routing and other computations on network traffic data. The highly efficient matrix multiplication process within the optical domain of various embodiments enables important computational functionality currently too expensive (in terms of latency, energy, and cost) to manage on current data traffic rates. This will enable ternary searches to occur efficiently at data rates of 100 Gbps and higher. Moreover, the ability to store a "don't care" bit within a TCAM cell utilizing optical filters enables full ternary search capabilities utilizing a photonics platform. With the increasing adoption of optics within computing devices, the ability to provide the full range of ternary searching within a photonics chip is important to ensure that TCAM searches do not develop into a bottleneck for efficiency.

Figure 12:
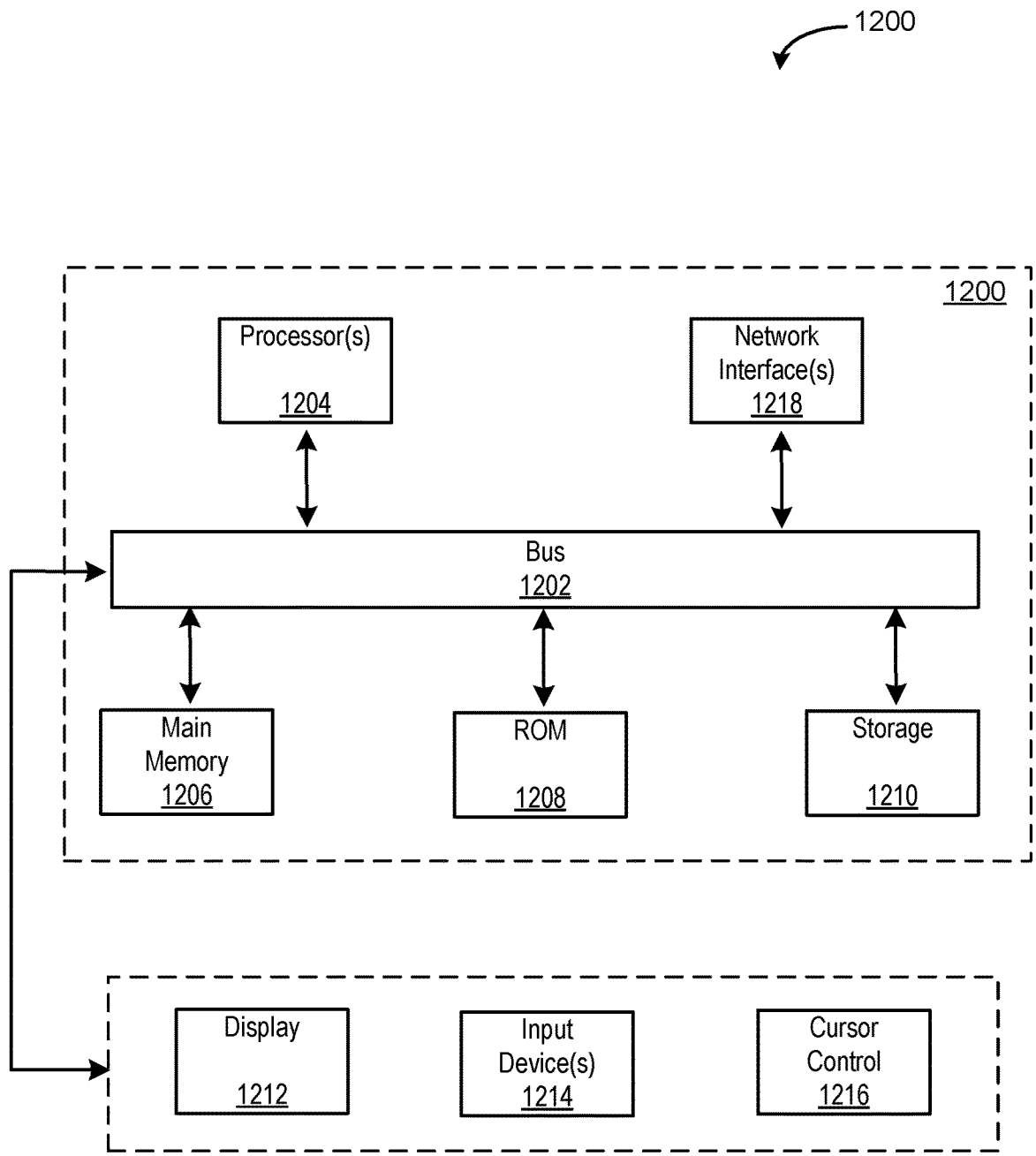
FIG. 12 is an example computing component that may be used to implement various features of embodiments described in the present disclosure.

FIG. 12 depicts a block diagram of an example computer system 1200 in which various of the embodiments described herein may be implemented. The computer system 1200 includes a bus 1202 or other communication mechanism for communicating information, one or more hardware processors 1204 coupled with bus 1202 for processing information. Hardware processor(s) 1204 may be, for example, one or more general purpose microprocessors.

The computer system 1200 also includes a main memory 1206, such as a random access memory (RAM), cache and/or other dynamic storage devices, coupled to bus 1202 for storing information and instructions to be executed by processor 1204. Main memory 1206 also may be used for storing temporary variables or other intermediate information during execution of instructions to be executed by processor 1204. Such instructions, when stored in storage media accessible to processor 1204, render computer system 1200 into a special-purpose machine that is customized to perform the operations specified in the instructions.

The computer system 1200 further includes a read only memory (ROM) 1208 or other static storage device coupled to bus 1202 for storing static information and instructions for processor 1204. A storage device 1210, such as a magnetic disk, optical disk, or USB thumb drive (Flash drive), etc., is provided and coupled to bus 1202 for storing information and instructions.

The computer system 1200 may be coupled via bus 1202 to a display 1212, such as a liquid crystal display (LCD) (or touch screen), for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. In some embodiments, the same direction information and command selections as cursor control may be implemented via receiving touches on a touch screen without a cursor.

The computing system 1200 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1200 may implement the techniques described herein using customized hard-wired logic, one or more ASICs or FPGAs, firmware and/or program logic which in combination with the computer system causes or programs computer system 1200 to be a special-purpose machine. According to one embodiment, the techniques herein are performed by computer system 1200 in response to processor(s) 1204 executing one or more sequences of one or more instructions contained in main memory 1206. Such instructions may be read into main memory 1206 from another storage medium, such as storage device 1210. Execution of the sequences of instructions contained in main memory 1206 causes processor(s) 1204 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1200. Volatile media includes dynamic memory, such as main memory 1206. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1202. Transmission media can also take the form of acoustic or light waves, such as those generated during radio-wave and infra-red data communications.

The computer system 1100 also includes a communication interface 1218 coupled to bus 1202. Network interface 1218 provides a two-way data communication coupling to one or more network links that are connected to one or more local networks. For example, communication interface 1218 may be an integrated services digital network (ISDN) card, cable modem, satellite modem, or a modem to provide a data communication connection to a corresponding type of telephone line. As another example, network interface 1218 may be a local area network (LAN) card to provide a data communication connection to a compatible LAN (or WAN component to communicated with a WAN). Wireless links may also be implemented. In any such implementation, network interface 1218 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 1218, which carry the digital data to and from computer system 1200, are example forms of transmission media.

The computer system 1200 can send messages and receive data, including program code, through the network(s), network link and communication interface 1218. In the Internet example, a server might transmit a requested code for an application program through the Internet, the ISP, the local network and the communication interface 1218.

The received code may be executed by processor 1204 as it is received, and/or stored in storage device 1210, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing"

environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1200.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An optical ternary content addressable memory (TCAM) comprising:
    a search input configured to convert a multi-wavelength input signal encoded with a search word into a plurality of search optical signals;
    a plurality of TCAM word entries, each TCAM word entry comprising:
        an input waveguide configured to optically couple to one of a plurality of search optical signals;
        an output match waveguide; and
        a plurality of TCAM cells, each TCAM cell comprising a plurality of optical filters disposed between the input waveguide and the output match waveguide;
    a plurality of photodetectors, each photodetector optically coupled to a results end of a respective output match waveguide of a TCAM word entry,
    wherein each TCAM cell is configured to store one of a logic '0', a logic '1', or a wildcard value, and each photodetector is configured to detect a mismatch between a respective search optical signal and a respective TCAM entry by detecting light of at least one wavelength of the multi-wavelength input signal.

2. The optical TCAM of claim 1, wherein each bit position of the search word is associated with a bit position-specific set of wavelengths of the input multiwavelength input signal, and each bit position of the search word is encoded as either light of a first wavelength of the bit position-specific set of wavelengths or light of a second wavelength of the bit position-specific set of wavelengths.

3. The optical TCAM of claim 1, wherein each TCAM cell comprises a set of optical filters of the plurality of optical filters comprising a first optical filter and a second optical filter.

4. The optical TCAM of claim 3, wherein:
    a TCAM cell represents a logic '0' when the first optical filter is tuned to block light of a first wavelength of the bit position-specific set of wavelengths and the second optical filter is tuned to pass light of a second wavelength of the bit position-specific set of wavelengths;
    a TCAM cell represents a logic '1' when a first optical filter is tuned to pass light of a first wavelength of the bit position-specific set of wavelengths and a second optical filter is tuned to block light of a second wavelength of the bit position-specific set of wavelengths; and
    a TCAM cell represents a wildcard value when a first optical filter is tuned to block light of a first wavelength of the bit position-specific set of wavelengths and a second optical filter is tuned to block light of a second wavelength of the bit position-specific set of wavelengths.

5. The optical TCAM of claim 3, wherein:
    the first optical filter of the plurality of TCAM cells are optically coupled to the input waveguide and the second optical filter of the respective TCAM entry, and
    the second optical filter of the plurality of TCAM cells are optically coupled to the first optical filter and the output match waveguide of the respective TCAM entry.

6. The optical TCAM of claim 3, wherein:
    the first optical filter of the plurality of TCAM cells are optically coupled to the input waveguide and the second optical filter of the respective TCAM entry, and
    the second optical filter of the plurality of TCAM cells are optically coupled to the first optical filter and the output match waveguide of the respective TCAM entry.

7. The optical TCAM of claim 1, wherein each of the plurality of photodetectors comprise a photodiode, the optical TCAM further comprising a transimpedance amplifier connected to an output of each photodiode.

8. A method comprising:
receiving, by a search input, one or more search words;
encoding, by the search input, a multi-wavelength input signal with the search word;
converting, by the search input, each of the one or more search words onto one or more optical search signals;
inputting, by the search input, the one or more optical search signals to an input waveguide of each of a plurality of TCAM entries of an optical search engine;
sensing, by a plurality of photodetectors, an resultant optical signal on an output waveguide of a plurality of output waveguides of the optical search engine, each output waveguide associated with at least on TCAM entry of the optical search engine; and
in response to detecting light on an output waveguide associated with at least on TCAM entry of the optical search engine, indicating, by the respective photodetector, a mismatch between the optical search signal received from the search input and a stored word in the respective TCAM entry,
wherein each bit position of a TCAM entry and each bit position of a search word of the one or more search words are encoded as an amplitude, a wavelength, or a combination of both.

9. The method of claim 8, wherein each TCAM entry of the optical search engine comprises a plurality of TCAM cells, each TCAM cell comprising a set of optical filters.

10. The method of claim 9, further comprising:
receiving, by a programming controller, at least one word to be stored in a TCAM entry of the plurality of TCAM entries, the at least one word comprising a plurality of bits;
storing, by the programming controller, a bit value for each bit of the plurality of bits within a TCAM cell of the plurality of TCAM cells of the TCAM entry, wherein:
a TCAM cell represents a logic '0' when a first optical filter is tuned to block light of a first wavelength of the bit position-specific set of wavelengths and a second optical filter is tuned to pass light of a second wavelength of the bit position-specific set of wavelengths;
a TCAM cell represents a logic '1' when a first optical filter is tuned to pass light of a first wavelength of the bit position-specific set of wavelengths and a second optical filter is tuned to block light of a second wavelength of the bit position-specific set of wavelengths; and
a TCAM cell represents a wildcard value when a first optical filter is tuned to block light of a first wavelength of the bit position-specific set of wavelengths and a second optical filter is tuned to block light of a second wavelength of the bit position-specific set of wavelengths.

11. The method of claim 8, further comprising:
receiving, by a programming controller, at least one word to be stored in a TCAM entry of the plurality of TCAM entries, the at least one word comprising a plurality of bits;
storing, by the programming controller, a bit value for each bit of the plurality of bits within a TCAM cell of the plurality of TCAM cells of the TCAM entry, wherein:
a TCAM cell represents a logic '0' when a first port of an optical filter is set to pass light having an amplitude and a second port of the optical filter is tuned to block light having an amplitude;
a TCAM cell represents a logic '1' when the first port of the optical filter is set to block light having an amplitude and the second port of the optical filter is tuned to pass light having an amplitude; and
a TCAM cell represents a wildcard value when the first port of the optical filter is set to block light having an amplitude and the second port of the optical filter is tuned to block light having an amplitude.

12. The method of claim 11, wherein the optical filter comprises a multipath interferometer, the first port comprises a first input arm of the multipath interferometer, and the second port comprises a second input arm of the multipath interferometer.

13. The method of claim 11, wherein the optical filter comprises a first multipath interferometer and a second interferometer, the first port comprises the first multipath interferometer, and the second port comprises the second interferometer.

14. The method of claim 8, the optical search engine comprises a hardware matrix multiplier configured to perform singular value decomposition (SVD), the hardware matrix multiplier comprising:
a first unitary matrix comprising a plurality of first optical filters and a plurality of input waveguides, a set of input waveguides of the plurality of input waveguides being associated with a bit position of a search word;
a diagonal matrix comprising a plurality of optical modulators optically coupled to the first matrix; and
a second unitary matrix comprising a plurality of second optical filters and a plurality of output waveguides, each output waveguide associated with a stored word encoded in the hardware matrix multiplier,
wherein a bit value is indicated by inputting an optical signal with an amplitude on one of the associated input waveguides for the respective bit position of the search word.

15. The method of claim 14, wherein the hardware matrix multiplier stores one or more sets of stored words, wherein:
each set of stored words is encoded as a separate wavelength of a plurality of wavelengths; and
each of the first optical filters, the optical modulators, and the second optical filters apply a different operation to a signal depending on a wavelength of the signal.

16. An optical ternary content addressable memory (TCAM) comprising:
a search input configured to receive one or more search words from a search word source;
an optical search engine optically coupled to the search input, the optical search engine configured to store a plurality of TCAM stored words; and
a photodetector array comprising a plurality of photodetectors optically coupled to a plurality of output waveguides of the optical search engine, each photodetector of the photodetector array associated with an output waveguide of the plurality of output waveguides,
wherein each search word is encoded using an amplitude inputted onto an input waveguide of a set of input waveguides associated with a bit position of the search word and the optical search engine is configured to coherently add two or more output result signals on each output waveguide to indicate at least one mismatched bit of the search word and the output waveguide of a respective TCAM stored word.

17. The optical TCAM of claim 16, wherein the optical search engine comprises:

a first unitary matrix comprising a plurality of first lattice filters and the plurality of input waveguides of the optical search engine;

a diagonal matrix comprising a plurality of optical modulators optically coupled to the first unitary matrix; and a second unitary matrix comprising a plurality of second lattice filters and the plurality of output waveguides of the optical search engine, wherein each lattice filter is configured to represent a bit value for a bit position of the plurality of TCAM stored words.

18. The optical TCAM of claim 17, wherein:

the plurality of TCAM stored words comprises a first set of TCAM stored words encoded on a first wavelength and a second set of TCAM stored words encoded on a second wavelength, and wherein each of the first lattice filters, the optical modulators, and the second lattice filters are configured to compare the first set of TCAM stored words to an input signal of the first wavelength and compare the second set of TCAM stored words to an input signal of the second wavelength.

19. The optical TCAM of claim 16, wherein the optical search engine comprises a bank of TCAM stored words, each TCAM stored word comprising a plurality of TCAM cells having a first port and a second port.

20. The optical TCAM of claim 19, wherein each TCAM cell is optically coupled to a summation layer configured to coherently add two or more output signals from the plurality of TCAM cells of each TCAM stored word.

* * * * *